(12) United States Patent
Ren et al.

(10) Patent No.: US 12,347,643 B2
(45) Date of Patent: Jul. 1, 2025

(54) MULTIPLE CHARGED-PARTICLE BEAM APPARATUS AND METHODS OF OPERATING THE SAME USING MOVABLE LENSES

(71) Applicant: ASML Netherlands B.V., Veldhoven (NL)

(72) Inventors: Weiming Ren, San Jose, CA (US); Xuedong Liu, San Jose, CA (US); Xuerang Hu, San Jose, CA (US); Zhong-wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/888,424

(22) Filed: May 29, 2020

(65) Prior Publication Data
US 2020/0381212 A1 Dec. 3, 2020

Related U.S. Application Data

(60) Provisional application No. 62/985,660, filed on Mar. 5, 2020, provisional application No. 62/855,717, filed on May 31, 2019.

(51) Int. Cl.
*H01J 37/31* (2006.01)
*H01J 37/14* (2006.01)
(Continued)

(52) U.S. Cl.
CPC ........ *H01J 37/3177* (2013.01); *H01J 37/141* (2013.01); *H01J 37/1478* (2013.01); (Continued)

(58) Field of Classification Search
CPC .. H01J 37/3177; H01J 37/141; H01J 37/1478; H01J 37/28; H01J 2237/0435;
(Continued)

(56) References Cited

U.S. PATENT DOCUMENTS

| 7,129,502 B2 | 10/2006 | Kruit |
| 9,922,799 B2 * | 3/2018 | Li ................... H01J 37/10 |

(Continued)

FOREIGN PATENT DOCUMENTS

| JP | 2007-513460 A | 5/2007 |
| TW | 201833968 A | 9/2018 |

(Continued)

OTHER PUBLICATIONS

International Search Report from the PCT, International Appln. No. PCT/EP2020/063833, dated—Sep. 30, 2020, 6 pages.
(Continued)

*Primary Examiner* — Nicole M Ippolito
(74) *Attorney, Agent, or Firm* — Finnegan, Henderson, Farabow, Garrett & Dunner, LLP

(57) ABSTRACT

Systems and methods of reducing the Coulomb interaction effects in a charged particle beam apparatus are disclosed. The charged particle beam apparatus may comprise a charged particle source and a source conversion unit comprising an aperture-lens forming electrode plate configured to be at a first voltage, an aperture lens plate configured to be at a second voltage that is different from the first voltage for generating a first electric field, which enables the aperture-lens forming electrode plate and the aperture lens plate to form aperture lenses of an aperture lens array to respectively focus a plurality of beamlets of the charged particle beam, and an imaging lens configured to focus the plurality of beamlets on an image plane. The charged particle beam apparatus may comprise an objective lens configured to focus the plurality of beamlets onto a surface of the sample and form a plurality of probe spots thereon.

20 Claims, 19 Drawing Sheets

(51) Int. Cl.
*H01J 37/141* (2006.01)
*H01J 37/147* (2006.01)
*H01J 37/28* (2006.01)
*H01J 37/317* (2006.01)

(52) U.S. Cl.
CPC ....... *H01J 37/28* (2013.01); *H01J 2237/0435* (2013.01); *H01J 2237/04922* (2013.01); *H01J 2237/24564* (2013.01); *H01J 2237/2817* (2013.01)

(58) Field of Classification Search
CPC ... H01J 2237/04922; H01J 2237/24564; H01J 2237/2817
See application file for complete search history.

(56) References Cited

U.S. PATENT DOCUMENTS

| | | | | |
|---|---|---|---|---|
| 2004/0012765 | A1* | 1/2004 | Akutsu | B82Y 40/00 355/53 |
| 2004/0232349 | A1* | 11/2004 | Kruit | H01J 37/12 250/396 R |
| 2006/0289804 | A1* | 12/2006 | Knippelmeyer | H01J 37/3177 250/492.22 |
| 2016/0247663 | A1 | 8/2016 | Schubert et al. | |
| 2017/0025241 | A1 | 1/2017 | Li et al. | |
| 2017/0025243 | A1* | 1/2017 | Ren | H01J 37/28 |
| 2017/0213688 | A1* | 7/2017 | Ren | H01J 37/226 |

FOREIGN PATENT DOCUMENTS

| | | |
|---|---|---|
| TW | 201907438 A | 2/2019 |
| TW | 201917767 A | 5/2019 |
| WO | WO 2019/057644 | 3/2019 |
| WO | WO 2019/068666 A1 | 4/2019 |

OTHER PUBLICATIONS

Office Action of the Intellectual Property Office issued in related Taiwanese Patent Application No. 109117437; mailed Jun. 22, 2021 (18 pgs.).

Notice of Reasons for Rejection issued by the Japan Patent Office in related Japanese Patent Application No. 2021-565991; mailed Dec. 6, 2022 (9 pgs.).

* cited by examiner

MULTIPLE CHARGED-PARTICLE BEAM APPARATUS AND METHODS OF OPERATING THE SAME USING MOVABLE LENSES

CROSS-REFERENCE TO RELATED APPLICATIONS

This application claims priority of U.S. application 62/855,717 which was filed on May 31, 2019, and U.S. application 62/985,660 which was filed on Mar. 5, 2020, which are incorporated by reference in their entireties.

TECHNICAL FIELD

The embodiments provided herein disclose a multi-beam apparatus, and more particularly a multi-beam charged particle microscope with enhanced imaging resolution by reducing Coulomb interaction effects between the charged particles of charged particle beams.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more important. Although multiple electron beams may be used to increase the throughput, the Coulomb interaction effects between the multiple electron beams may limit the imaging resolution desired for reliable defect detection and analysis, rendering the inspection tools inadequate for their desired purpose.

SUMMARY

One aspect of the present disclosure is directed to a charged particle beam apparatus to inspect a sample. The charged particle beam apparatus may comprise a charged particle source configured to emit a charged particle beam along a primary optical axis, a source conversion unit, and an objective lens configured to focus the plurality of beamlets onto a surface of the sample and form a plurality of probe spots thereon. The source conversion unit may comprise an aperture-lens forming electrode plate configured to be at a first voltage, an aperture lens plate configured to be at a second voltage that is different from the first voltage for generating a first electric field, which enables the aperture-lens forming electrode plate and the aperture lens plate to form a plurality of aperture lenses of an aperture lens array to respectively focus a plurality of beamlets of the charged particle beam, and an imaging lens configured to focus the plurality of beamlets on an image plane.

The imaging lens may have a principal plane perpendicular to the primary optical axis. The principal plane of the imaging lens may be movable along the primary optical axis. The objective lens may have a principal plane perpendicular to the primary optical axis. The principal plane of the objective lens may be movable along the primary optical axis. The sample may be movable along the primary optical axis. The beam-limit aperture array is disposed in and is movable in a plane perpendicular to the primary optical axis.

A pitch of the plurality of probe spots can be changed by moving at least one of the principal plane of the imaging lens, the principal plane of the objective lens, or the sample. The source conversion unit further comprises a beam-limit aperture array configured to limit currents of the plurality of beamlets. The beam-limit aperture array may comprise a plurality of beam limiting apertures, and at least two beam limiting apertures of the plurality of beam limiting apertures may be dissimilar in size. The beam-limit aperture array may be configured to be at a third voltage for generating a second electric field between the aperture lens plate and the beam-limit aperture array.

The aperture lens plate may be positioned downstream of the aperture-lens forming electrode plate. The aperture lens plate may comprise a plurality of apertures configured to form the plurality of aperture lenses. Each of the plurality of aperture lenses may comprise an electrostatic lens.

The aperture-lens forming electrode plate may comprise an opening configured to allow passage of a portion of the charged particle beam. The first electric field may be uniform between the aperture-lens forming electrode plate and the aperture lens plate. A magnitude of the first electric field may be different from a magnitude of the second electric field, thereby forming a lens field corresponding to each aperture lens of the plurality of aperture lenses of the aperture lens array. The third voltage may be similar to the second voltage such that the second electric field is zero. The first, the second, and the third voltage may be dissimilar.

The charged particle beam apparatus may further comprise a beam separator to deflect a plurality of secondary beams towards a secondary imaging system, wherein the plurality of secondary beams are emerged from the sample due to incidence of the plurality of beamlets of the charged particle beam.

The charged particle beam apparatus may further comprise a transfer lens having a principal plane perpendicular to the primary optical axis. The transfer lens may be disposed downstream of the imaging lens. The principal plane of the transfer lens may be moveable within a range of positions along the primary optical axis. The transfer lens may be positioned at a distance from the imaging lens such that a position of the principal plane of the transfer lens coincides with the image plane. The transfer lens may be configured to direct the plurality of beamlets to the objective lens such that the plurality of beamlets normally land on the sample. The transfer lens may be configured to direct the plurality of beamlets to the objective lens such that the plurality of beamlets form the plurality of probe spots with small aberrations. A pitch of the plurality of probe spots can be changed by moving the position of the principal plane of the transfer lens. The charged particle beam apparatus may be configured such that the pitch of the plurality of probe spots increases as the distance between the imaging lens and the principal plane of the transfer lens increases.

The charged particle beam apparatus may further comprise a beamlet tilting deflector positioned downstream of the imaging lens. The beamlet tilting deflector may be positioned such that a deflection plane of the beamlet tilting deflector coincides with the image plane. The beamlet tilting deflector may be positioned between the imaging lens and the transfer lens. The deflection plane of the beamlet tilting deflector may coincide with the principal plane of the transfer lens. The beamlet tilting deflector may be configured to deflect the plurality of beamlets from the image plane to be incident on the sample at a tilting angle in relation to a surface normal of the sample. The beamlet tilting deflector may comprise an electrostatic deflector or a magnetic deflector. The tilting angle of the plurality of beamlets may be adjusted based on electrical excitation of the beamlet tilting deflector.

The transfer lens may comprise a plurality of electrodes disposed along an optical axis of the transfer lens and configured to enable generating a third electric field within the transfer lens. The plurality of electrodes may comprise an outer electrode and an inner electrode. The optical axis of the transfer lens may coincide with the primary optical axis. The third electric field may cause the principal plane of the transfer lens to coincide with the image plane.

The charged particle beam apparatus may further comprise a beamlet adjustment unit positioned downstream of the imaging lens. The beamlet adjustment unit may comprise a deflector array configured to deflect at least some of the plurality of beamlets to enable the plurality of beamlets to be normally incident on the objective lens. The beamlet adjustment unit comprises a field curvature compensator array configured to compensate for field curvature aberrations of the plurality of probe spots. The beamlet adjustment unit may comprise an astigmatism compensator array configured to compensate for astigmatism aberrations of the plurality of probe spots. The deflector array may be positioned downstream of the astigmatism compensator array and the field curvature compensator array. The beamlet adjustment unit may be configured to enable the plurality of beamlets to generate the plurality of probe spots with small aberrations.

The aperture lens array may be implemented via a plate with a plurality of first apertures. The aperture lens array may be implemented via a plurality of plates comprising a plurality of second apertures. The charged particle beam apparatus may further comprise a gun aperture plate disposed between the aperture lens array and the charged particle beam source and configured to block peripheral charged particles of the charged particle beam.

Another aspect of the present disclosure is directed to a method of inspecting a sample using a charged particle beam apparatus. The method may comprise activating a charged particle source to generate a charged particle beam, focusing a plurality of beamlets of the charged particle beam, using a plurality of aperture lenses of an aperture lens array, the plurality of aperture lenses formed by generating a first electric field between an aperture-lens forming electrode plate and an aperture lens plate. Generating the first electric field may comprise applying a first voltage to the aperture-lens forming electrode plate, and applying a second voltage that is different from the first voltage to the aperture lens plate, focusing, using an imaging lens, the plurality of beamlets on an image plane, and focusing, using an objective lens, the plurality of beamlets on a surface of the sample to form a plurality of probe spots thereon.

The method may further comprise adjusting, using a beam-limit aperture array, currents of the plurality of beamlets incident on the surface of the sample. The method may further comprise applying a third voltage to the beam-limit aperture array to generate a second electric field between the aperture lens plate and the beam-limit aperture array. A magnitude of the second electric field may be different from a magnitude of the first electric field.

A pitch of the plurality of probe spots may be adjusted based on a position of at least one of the imaging lens, the objective lens, or the sample, along a primary optical axis. The method may further comprise directing, using a transfer lens, the plurality of beamlets from the image plane to the objective lens such that the plurality of beamlets is normally incident on the sample. Directing the plurality of beamlets from the image plane to the objective lens using the transfer lens may generate the plurality of probe spots having small aberrations. The transfer lens may be positioned at a distance from the imaging lens such that a position of a principal plane of the transfer lens coincides with the image plane.

The method may further comprise adjusting a pitch of the plurality of probe spots by changing the position of the principal plane of the transfer lens in relation to the imaging lens along the primary optical axis. The method may further comprise generating a third electric field within the transfer lens to adjust the position of the principal plane of the transfer lens to coincide with the image plane. The method may further comprise deflecting, using a beamlet tilting deflector, the plurality of beamlets from the image plane to be incident on the sample at a tilting angle in relation to a surface normal of the sample. The tilting angle of the plurality of beamlets is adjusted based on electrical excitation of the beamlet tilting deflector. The beam-tilting deflector may be positioned such that a deflection plane of the beamlet tilting deflector coincides with the image plane. The method may further comprise deflecting, using a deflector array, at least some of the plurality of beamlets to enable the plurality of beamlets to be normally or substantially normally incident on the objective lens. The method may further comprise deflecting using the deflector array, at least some of the plurality of beamlets to enable the plurality of beamlets to generate the plurality of probe spots with small aberrations.

The method may further comprise compensating, using a field curvature compensator array, for field curvature aberrations of the plurality of probe spots. The method may further comprise compensating, using an astigmatism compensator array, for astigmatism aberrations of the plurality of probe spots. The method may comprise blocking, using a gun aperture plate, peripheral charged particles of the charged particle beam from being incident on the aperture-lens forming electrode plate.

Another aspect of the present disclosure is directed to a non-transitory computer readable medium storing a set of instructions that is executable by one or more processors of a charged particle beam apparatus to cause the charged particle beam apparatus to perform a method of inspecting a sample. The method may comprise activating a charged particle source to generate a charged particle beam, forming a plurality of aperture lenses of an aperture lens array to respectively focus a plurality of beamlets of the charged particle beam, wherein the plurality of beamlets are focused, using an imaging lens, on an imaging plane to form a plurality of images that are projected onto a surface of the sample to generate a plurality of probe spots. Forming plurality of aperture lenses of an aperture lens array may comprise applying a first voltage to an aperture-lens forming electrode plate, and applying a second voltage to an aperture lens plate that is different from the first voltage so that a first electric field is generated between the aperture-lens forming electrode plate and the aperture lens plate.

The set of instructions that is executable by one or more processors of a charged particle beam apparatus cause the charged particle beam apparatus to further perform applying a third voltage to a beam-limit aperture array to generate a second electric field between the aperture lens plate and the beam-limit aperture array; positioning the beam-limit aperture array configured to limit currents of a plurality of beamlets of the charged particle beam; and positioning the imaging lens along a primary optical axis to form the plurality of images on the image plane.

Another aspect of the present disclosure is directed to a charged particle beam apparatus to inspect a sample. The apparatus may comprise a charged particle source configured to emit a charged particle beam along a primary optical axis, a source conversion unit, and an objective lens configured to focus the plurality of beamlets onto a surface of the sample and form a plurality of probe spots thereon. The source conversion unit may comprise an aperture lens array configured to focus a plurality of beamlets of the charged particle beam and an imaging lens configured to focus the plurality of beamlets on an image plane. The source conversion unit may further comprise a beam-limit aperture array configured to limit currents of the plurality of beamlets. The aperture lens array may comprise an aperture-lens forming electrode plate and an aperture lens plate. The aperture-lens forming electrode plate may be configured to be at a first voltage, the aperture lens plate is configured to be at a second voltage that is different from the first voltage for generating a first electric field between the aperture-forming lens electrode plate and the aperture lens plate, and wherein the first electric field enables the aperture-lens forming electrode plate and the aperture lens plate to form an aperture lens array comprising a plurality of aperture lenses.

Other advantages of the embodiments of the present disclosure will become apparent from the following description taken in conjunction with the accompanying drawings wherein are set forth, by way of illustration and example, certain embodiments of the present invention.

DETAILED DESCRIPTION

Figure 1:
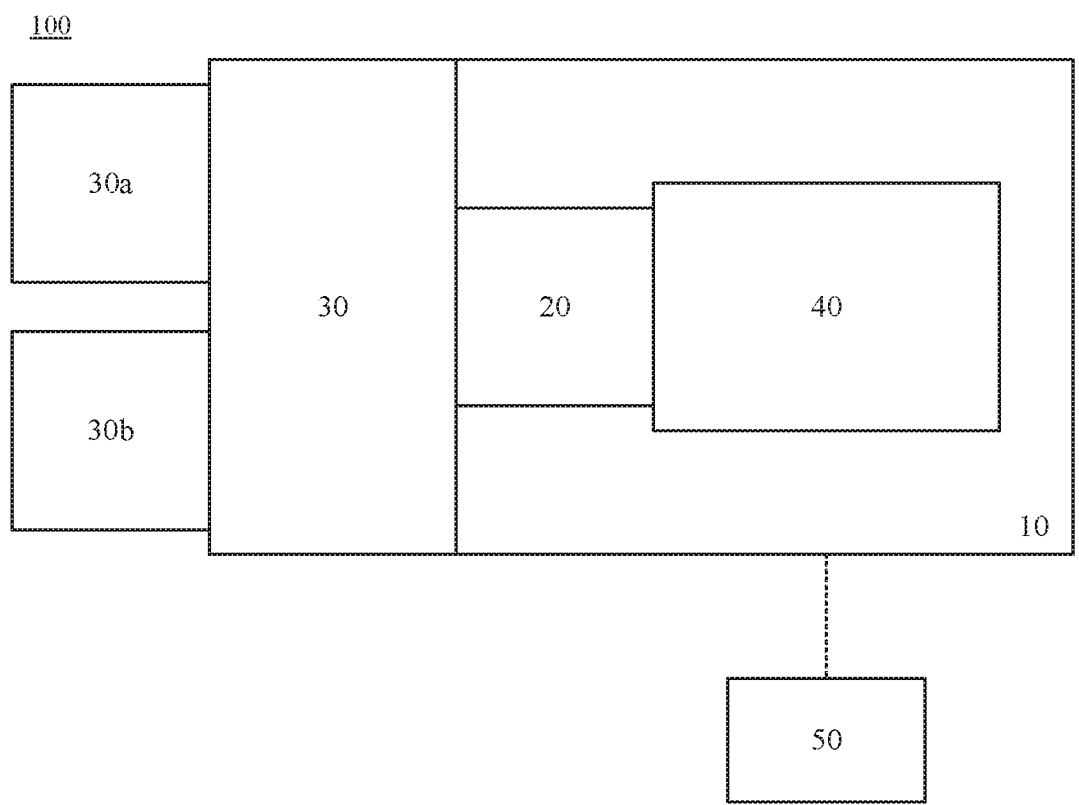
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC, thereby rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

Although a multiple charged-beam particle imaging system, such as a multi-beam SEM, may be useful in increasing the wafer inspection throughput, the imaging resolution of multi-beam SEM may be negatively affected by the Coulomb interaction effects. In order to achieve high throughput, it is desirable that the beam contains as many electrons as possible. However, due to the repulsive Coulomb interaction between electrons, it is difficult to confine a large number of electrons in a very small volume. Moreover, these interactions may broaden the width of the beam and change the direction of the flight of electrons. As a result, the probe spot will be larger, thus negatively impacting the overall resolution of the SEM. Therefore, it is desirable to mitigate the Coulomb interaction effects for maintaining high resolution of multi-beam SEMs.

In currently existing multi-beam SEMs, one of the several problems that may be encountered is increased Coulomb interaction effects because the electrons travel a longer distance through a number of components along the microscope column before they are focused and filtered to determine the final probe current of the beamlets. In addition, even if the electron beamlets are focused using electro-optical mechanisms closer to the electron source, the final probe currents of the electron beamlets may not be determined until the electron beam has traveled through the components, thereby increasing the possibility of Coulomb interaction effects and adversely impacting the resolution and inspection throughput. Therefore, it may be desirable to focus and filter the electron beamlets by a mechanism that allows focusing and determining the final probe currents of the beamlets as close to the electron source as possible to minimize the Coulomb interaction effects.

In some embodiments of the present disclosure, a multi-beam apparatus may include an electron source configured to emit electrons along a primary optical axis to form the primary electron beam. The apparatus may also include a source-conversion unit comprising an aperture lens forming electrode plate configured to be at a first voltage, and an aperture lens plate comprising a plurality of apertures configured to be at a second voltage different from the first voltage. The difference in the first and the second voltage may generate an electric field which enables the aperture-lens forming electrode plate and the apertures of the aperture lens plate to form a plurality of aperture lenses. Each of the plurality of aperture lenses may be configured to focus a plurality of beamlets of the primary electron beam. The source-conversion unit may further comprise an imaging lens configured to focus the plurality of beamlets on an intermediate image plane. The apparatus may further include an objective lens configured to focus the plurality of beamlets onto a surface of the sample and from a plurality of probe spots thereon.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 100 includes a main chamber 10, a load-lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load-lock chamber 20.

Load-lock chamber 20 is connected to a load/lock vacuum pump system (not shown), which removes gas molecules in load-lock chamber 20 to reach a first pressure below the atmospheric pressure. After reaching the first pressure, one or more robot arms (not shown) transport the wafer from load-lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool. In other embodiments, electron beam tool 40 may comprise a multi-beam inspection tool.

Controller 50 may be electronically connected to electron beam tool 40 and may be electronically connected to other components as well. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load-lock chamber 20, and EFEM 30, it is appreciated that controller 50 can be part of the structure.

While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
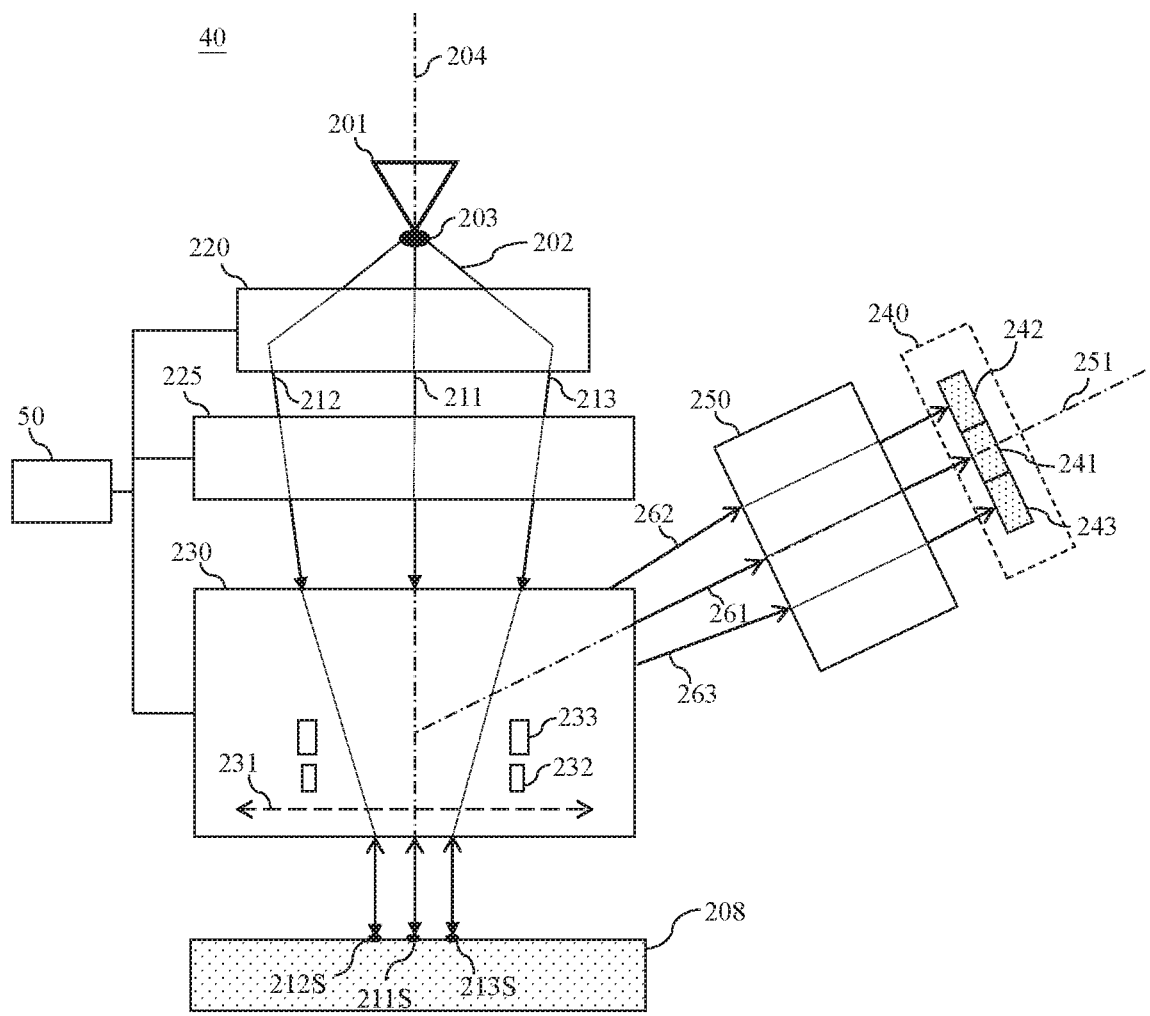
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary electron beam tool 40 that can be a part of the exemplary charged particle beam inspection system 100 of FIG. 1, consistent with embodiments of the present disclosure. Electron beam tool 40 (also referred to herein as apparatus 40) may comprise an electron source 201, a source conversion unit 220, a primary projection optical system 230, a secondary imaging system 250, and an electron detection device 240. It may be appreciated that other commonly known components of apparatus 40 may be added/omitted as appropriate.

Although not shown in FIG. 2, in some embodiments, electron beam tool 40 may comprise a gun aperture plate, a pre-beamlet forming mechanism, a condenser lens, a motorized sample stage, a sample holder to hold a sample (e.g., a wafer or a photomask).

Electron source 201, source conversion unit 220, deflection scanning unit 232, beam separator 233, and primary projection optical system 230 may be aligned with a primary optical axis 204 of apparatus 40. Secondary imaging system 250 and electron detection device 140 may be aligned with a secondary optical axis 251 of apparatus 40.

Electron source 201 may include a cathode, an extractor or an anode, wherein primary electrons can be emitted from the cathode and extracted or accelerated to form a primary electron beam 202 that forms a primary beam crossover (virtual or real) 203. Primary electron beam 202 can be visualized as being emitted from primary beam crossover 203.

Source conversion unit 220 may comprise an aperture lens array, a beam-limit aperture array, and an imaging lens. The aperture lens array may comprise an aperture-lens forming electrode plate and an aperture lens plate positioned below the aperture-lens forming electrode plate. In this context, "below" refers to the structural arrangement such that primary electron beam 202 traveling downstream from electron source 201 irradiates the aperture-lens forming electrode plate before the aperture lens plate. The aperture-lens forming electrode plate may be implemented via a plate having an aperture configured to allow at least a portion of primary electron beam 202 to pass through. The aperture lens plate may be implemented via a plate having a plurality of apertures traversed by primary electron beam 202 or multiple plates having plurality of apertures. The aperture-lens forming electrode plate and the aperture lens plate may be excited to generate electric fields above and below the aperture lens plate. The electric field above the aperture lens plate may be different from the electric field below the aperture lens plate so that a lens field is formed in each aperture of the aperture lens plate, and the aperture lens array may thus be formed.

In some embodiments, the beam-limit aperture array may comprise beam-limit apertures. It is appreciated that any number of apertures may be used, as appropriate. The beam-limit aperture array may be configured to limit diameters of individual primary beamlets 211, 212, and 213. Although FIG. 2 shows three primary beamlets 211, 212, and 213 as an example, however, it is appreciated that source conversion unit 220 may be configured to form any number of primary beamlets.

In some embodiments, an imaging lens may comprise a collective imaging lens configured to focus primary beamlets 211, 212, and 213 on an image plane. Imaging lens may have a principal plane orthogonal to primary optical axis 204. Imaging lens may be positioned below beam-limit aperture array and may be configured to focus primary beamlets 211, 212, and 213 such that the beamlets form a plurality of focused images of primary electron beam 202 on the intermediate image plane.

Primary projection optical system 230 may comprise an objective lens 231, a deflection scanning unit 232, and a beam separator 233. Beam separator 233 and deflection scanning unit 232 may be positioned inside primary projection optical system 230. Objective lens 231 may be configured to focus beamlets 211, 212, and 213 onto sample 208 for inspection and can form three probe spots 211S, 212S, and 213S, respectively, on surface of sample 208. In some embodiments, beamlets 211, 212, and 213 may land normally or substantially normally on objective lens 231. In some embodiments, focusing by the objective lens may include reducing the aberrations of the probe spots 211S, 212S, and 213S.

In response to incidence of primary beamlets 211, 212, and 213 on probe spots 211S, 212S, and 213S on sample 208, electrons may emerge from sample 208 and generate three secondary electron beams 261, 262, and 263. Each of secondary electron beams 261, 262, and 263 typically comprise secondary electrons (having electron energy ≤50 eV) and backscattered electrons (having electron energy between 50 eV and the landing energy of primary beamlets 211, 212, and 213).

Electron beam tool 40 may comprise beam separator 233. Beam separator 233 may be of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of beamlets 211, 212, and 213 is equal in magnitude and opposite in direction to the force exerted on the electron by magnetic dipole field B1. Beamlets 211, 212, and 213 can therefore pass straight through beam separator 233 with zero deflection angles.

Deflection scanning unit 232 may be configured to deflect beamlets 211, 212, and 213 to scan probe spots 211S, 212S, and 213S over three small scanned areas in a section of the surface of sample 208. Beam separator 233 may direct secondary electron beams 261, 262, and 263 towards secondary imaging system 250. Secondary imaging system 250 can focus secondary electron beams 261, 262, and 263 onto detection elements 241, 242, and 243 of electron detection device 240. Detection elements 241, 242, and 243 may be configured to detect corresponding secondary electron beams 261, 262, and 263 and generate corresponding signals used to construct images of the corresponding scanned areas of sample 208.

In FIG. 2, three secondary electron beams 261, 262, and 263 respectively generated by three probe spots 211S, 212S, and 213S, travel upward towards electron source 201 along primary optical axis 204, pass through objective lens 231 and deflection scanning unit 232 in succession. The three secondary electron beams 261, 262, and 263 are diverted by beam separator 233 (such as a Wien Filter) to enter secondary imaging system 250 along secondary optical axis 251 thereof. Secondary imaging system 250 may focus the three secondary electron beams 261, 262, and 263 onto electron detection device 140 which comprises three detection elements 241, 242, and 243. Therefore, electron detection device 240 can simultaneously generate the images of the three scanned regions scanned by the three probe spots 211S, 212S, and 213S, respectively. In some embodiments, electron detection device 240 and secondary imaging system 250 form one detection unit (not shown). In some embodiments, the electron optics elements on the paths of secondary electron beams such as, but not limited to, objective lens 231, deflection scanning unit 232, beam separator 233, secondary imaging system 250 and electron detection device 240, may form one detection system.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 50 may be configured to perform image processing steps with the multiple images of the same location of sample 208.

In some embodiments, controller 50 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 50 may control a motorized stage (not shown) to move sample 208 during inspection. In some embodiments, controller 50 may enable the motorized stage to move sample 208 in a direction continuously at a constant speed. In other embodiments, controller 50 may enable the motorized stage to change the speed of the movement of sample 208 over time depending on the steps of scanning process. In some embodiments, controller 50 may adjust a configuration of primary projection optical system 230 or secondary imaging system 250 based on images of secondary electron beams 261, 262, and 263.

In some embodiments, electron beam tool 40 may comprise a beamlet control unit 225 configured to receive primary beamlets 211, 212, and 213 from source conversion unit 220 and direct them towards sample 208. Beamlet control unit 225 may include a transfer lens configured to direct primary beamlets 211, 212, and 213 from the image plane to the objective lens such that primary beamlets 211, 212, and 213 normally or substantially normally land on surface of sample 208, or form the plurality of probe spots 221, 222, and 223 with small aberrations. Transfer lens may be a stationary or a movable lens. In a movable lens, the focusing power of the lens may be changed by adjusting the electrical excitation of the lens.

In some embodiments, beamlet control unit 225 may comprise a beamlet tilting deflector configured to may be configured to tilt primary beamlets 211, 212, and 213 to obliquely land on the surface of sample 208 with same or substantially same landing angles (Θ) with respect to the surface normal of sample 208. Tilting the beamlets may include shifting a crossover of primary beamlets 211, 212, and 213 slightly off primary optical axis 204. This may be useful in inspecting samples or regions of sample that include three-dimensional features or structures such as side walls of a well, or a trench, or a mesa structure.

In some embodiments, beamlet control unit 225 may comprise a beamlet adjustment unit configured to compensate for aberrations such as astigmatism and field curvature aberrations caused due to one or all of the lenses mentioned above. Beamlet adjustment unit may comprise an astigmatism compensator array, a field curvature compensator array, and a deflector array. The field curvature compensator array may comprise a plurality of micro-lenses to compensate field curvature aberrations of the primary beamlets 211, 212, and 213, and the astigmatism compensator array may comprise a plurality of micro-stigmators to compensate astigmatism aberrations of the primary beamlets 211, 212, and 213.

In some embodiments, the deflectors of the deflector array may be configured to deflect beamlets 211, 212, and 213 by varying angles towards primary optical axis 204. In some embodiments, deflectors farther away from primary optical axis 204 may be configured to deflect beamlets to a greater extent. Furthermore, deflector array may comprise multiple layers (not illustrated), and deflectors may be provided in separate layers. Deflectors may be configured to be individually controlled independent from one another. In some embodiments, a deflector may be controlled to adjust a pitch of probe spots (e.g., 221, 222, and 223) formed on a surface of sample 208. As referred to herein, pitch of the probe spots may be defined as the distance between two immediately adjacent probe spots on the surface of sample 208. In some embodiments, the deflectors may be placed on the intermediate image plane.

In some embodiments, controller 50 may be configured to control source conversion unit 220, beamlet control unit 225, and primary projection optical system 230, as illustrated in FIG. 2. Although not illustrated, controller 50 may be configured to control one or more components of electron beam tool 40 including, but not limited to, electron source 201 and components of source conversion unit 220, primary projection optical system 230, electron detection device 240, and secondary imaging system 250. Although FIG. 2 shows that electron beam tool 40 uses three primary electron beamlets 211, 212, and 213, it is appreciated that electron beam tool 40 may use two or more primary electron beamlets. The present disclosure does not limit the number of primary electron beamlets used in apparatus 40.

Figure 3A:
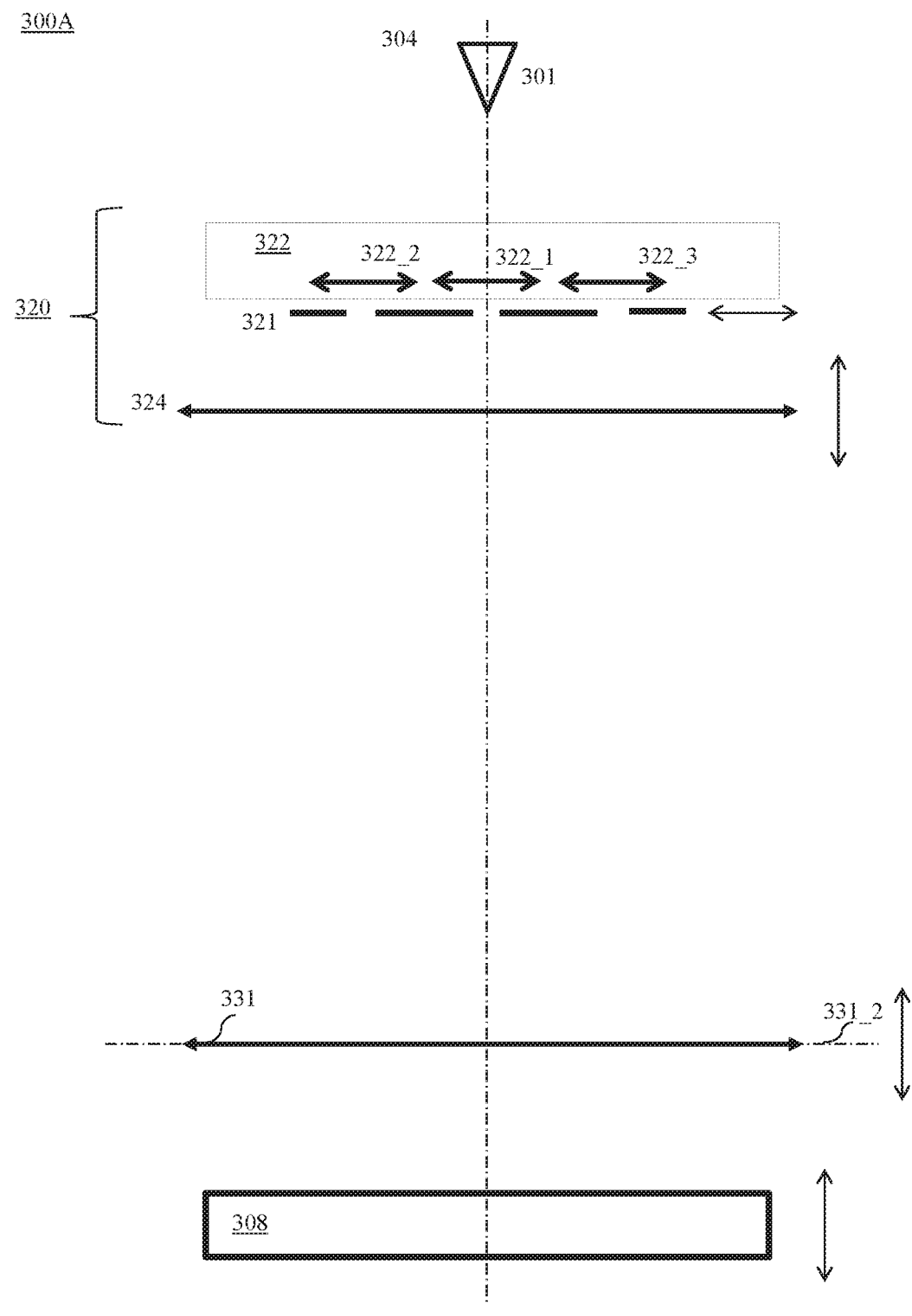
FIGS. 3A-3E are schematic diagrams illustrating exemplary configurations of an electron optics system in a multi-beam apparatus, consistent with embodiments of the present disclosure.
Figure 3B:
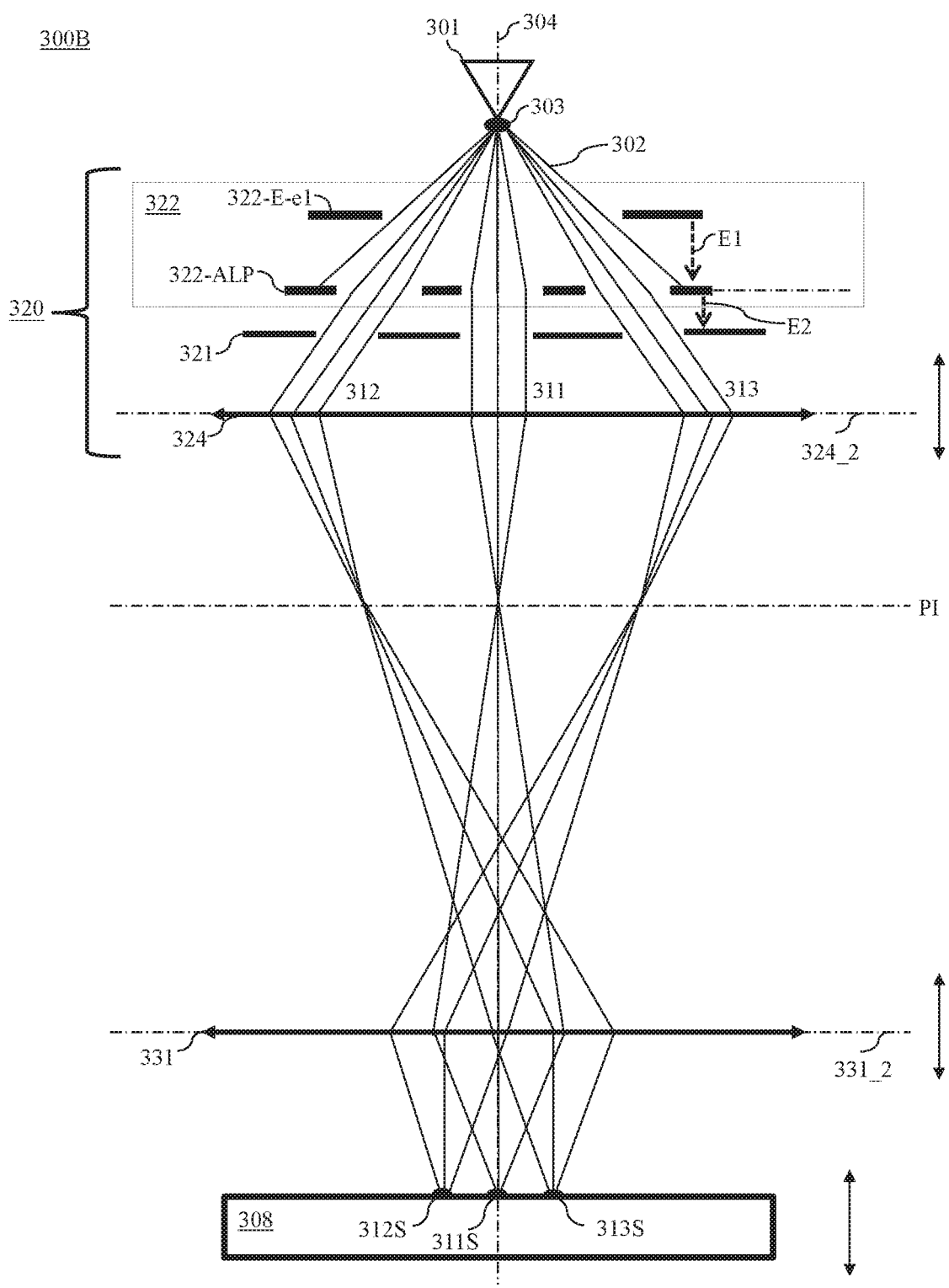
Figure 3C:
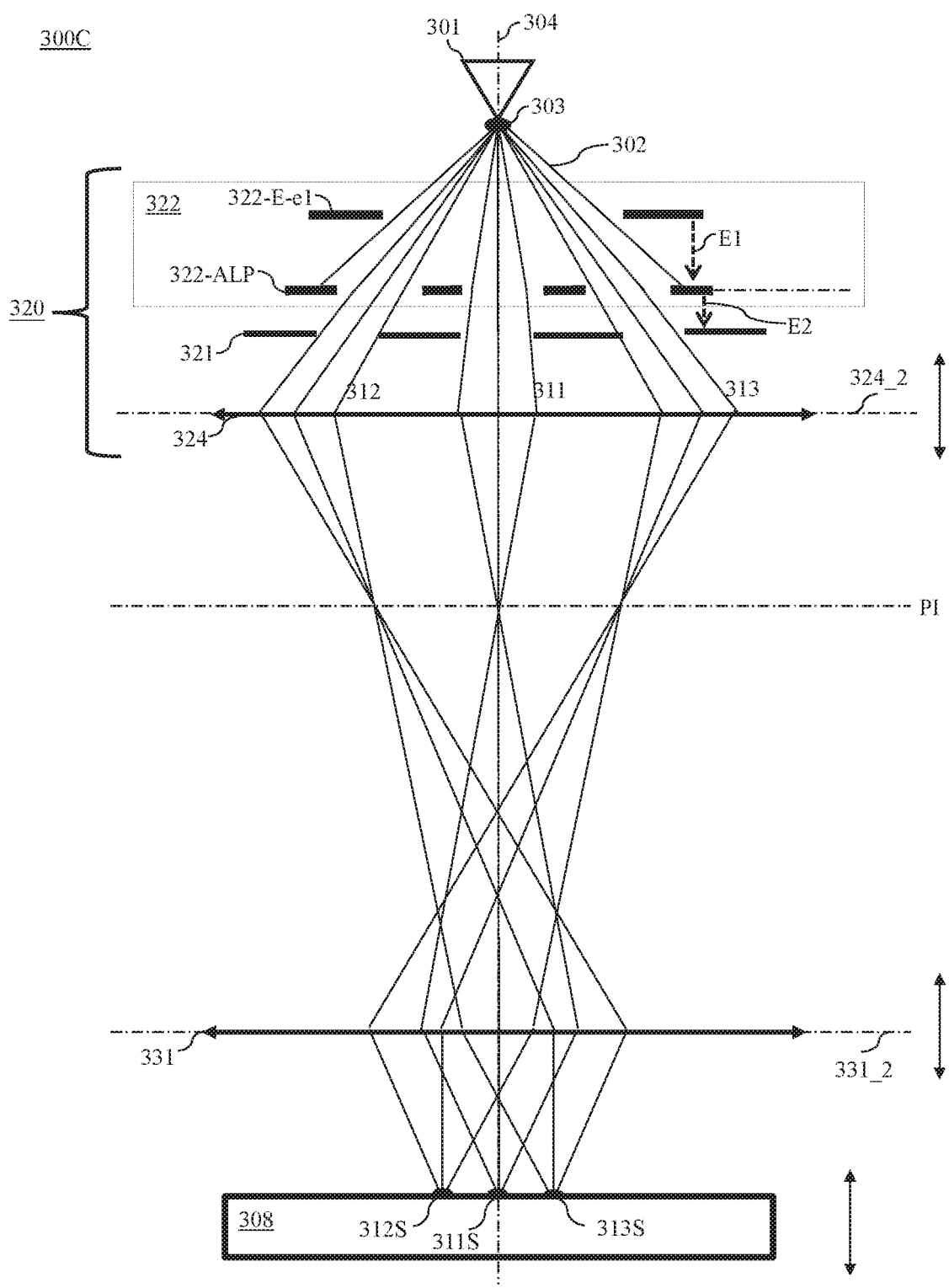
Figure 3D:
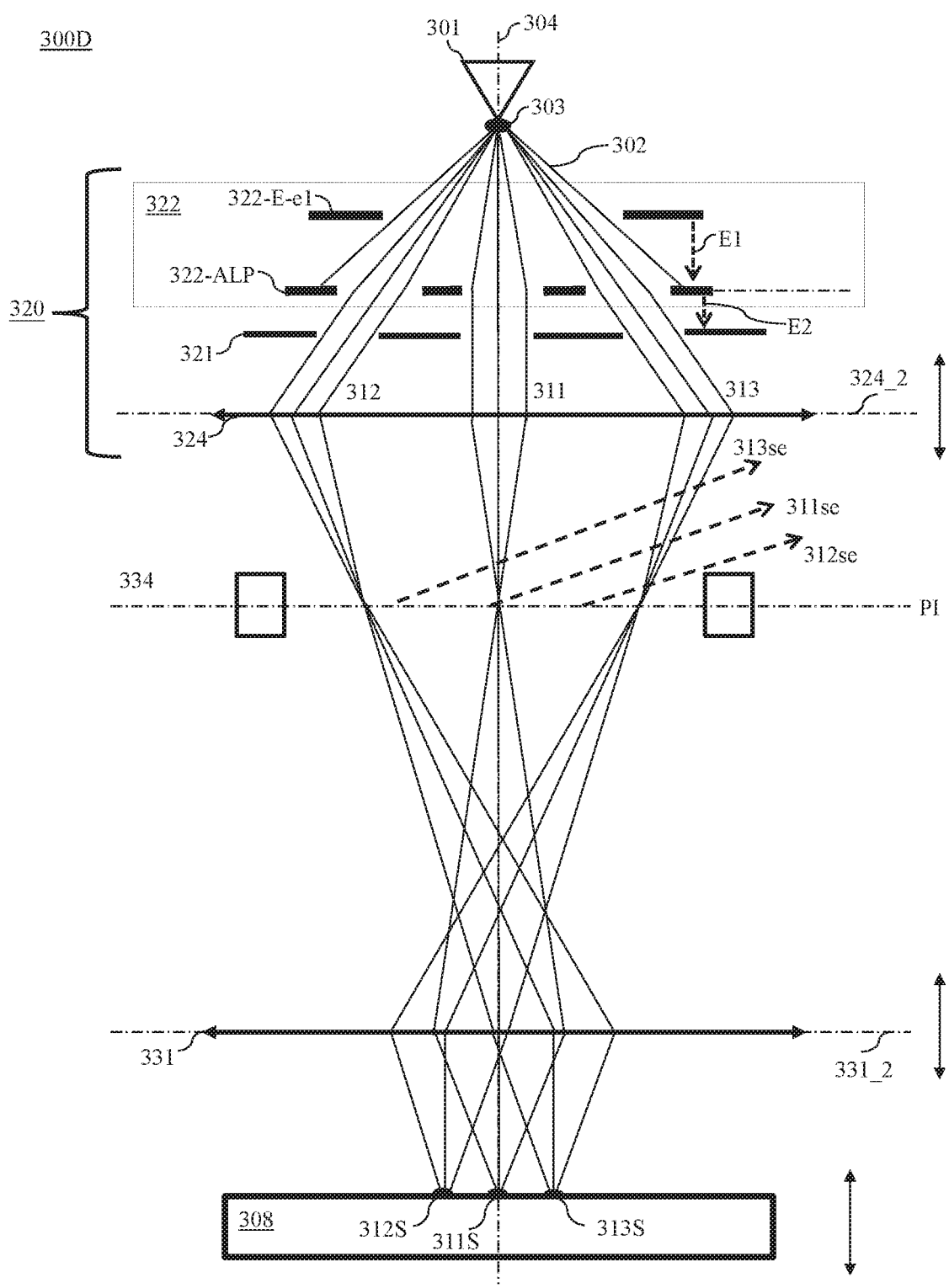
Figure 3E:
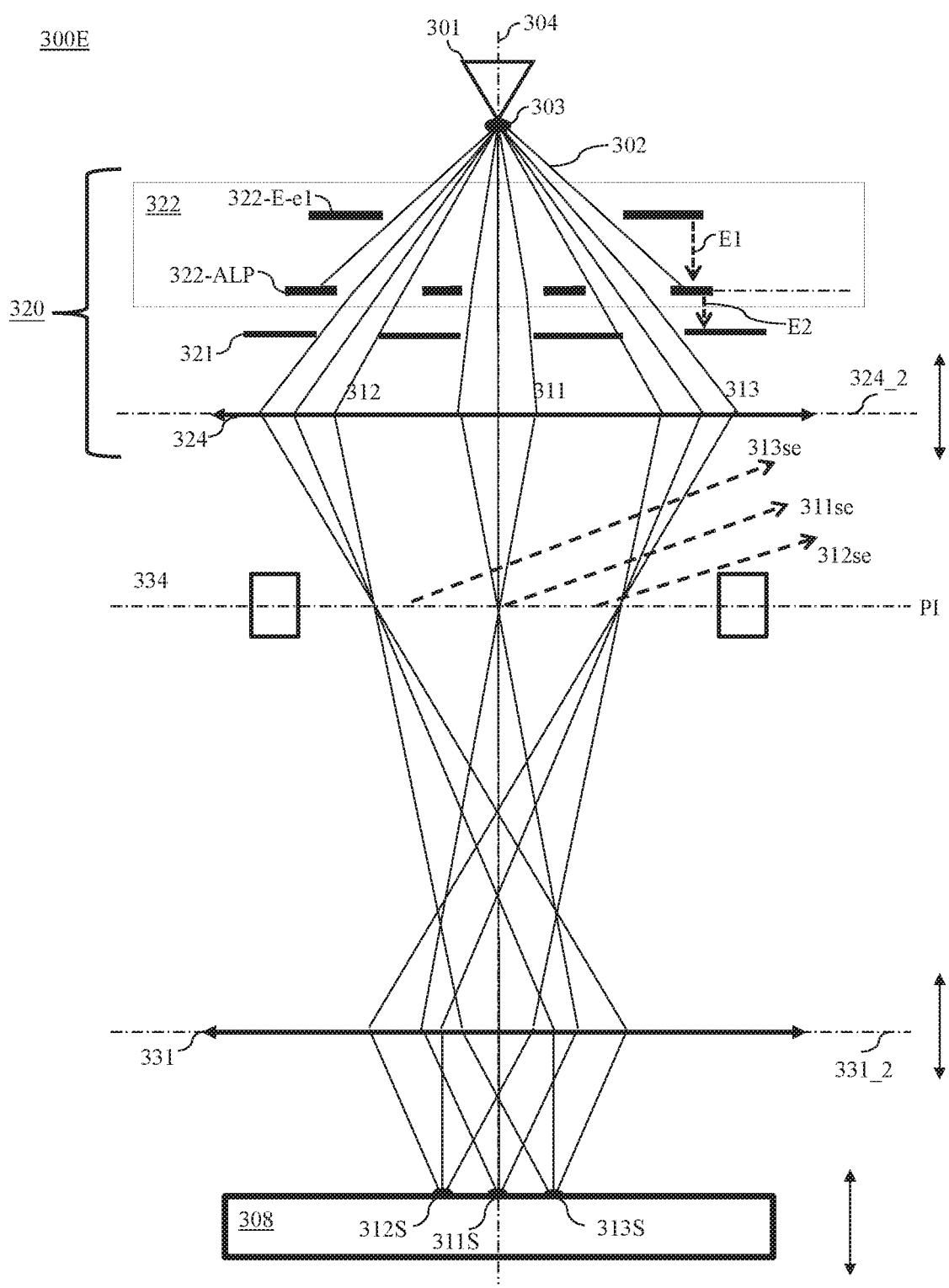

Reference is now made to FIGS. 3A-3E, which are schematic diagrams of exemplary configurations of an electron optics systems 300A-300E, respectively in a multi-beam apparatus, consistent with embodiments of the present disclosure. Electron optics systems 300A-300E may comprise electron source 301, source conversion unit 320, and objective lens 331. In some embodiments, a beam separator 334 may be included as shown in FIGS. 3D and 3E. It is appreciated that electron source 301, primary electron beam 302, source conversion unit 320, objective lens 331, and a beam separator 334 may be similar or substantially similar to the corresponding elements described in FIG. 2 and may perform similar functions.

Electron source 301 may be configured to emit primary electrons from a cathode and extracted or accelerated to form primary electron beam 302 that forms primary beam crossover (virtual or real) 303. In some embodiments, primary electron beam 302 can be visualized as being emitted from primary beam crossover 303 along primary optical axis 304. In some embodiments, one or more elements of electron optics systems 300A and 300B may be aligned with primary optical axis 304. Source conversion unit 320 may include a beam-limit aperture array 321, an aperture lens array 322, and an imaging lens 324. It is appreciated that source conversion unit 320 may include one or more other optical or electro-optical elements as described in relation to FIG. 2.

With reference to FIG. 3A, source conversion unit 320 may be positioned immediately downstream of electron source 301. As used in the context of this disclosure, "downstream" refers to a position of an element along the path of primary electron beam 302 starting from electron source 301, and "immediately downstream" refers to a position of a second element along the path of primary electron beam 302 such that there are no other elements between the first and the second element. For example, as illustrated in FIG. 3A, source conversion unit 320 may be positioned immediately downstream of electron source 301 such that there are no other optical or electro-optical elements placed between electron source 301 and source conversion unit 320. Such a configuration may be useful, among other things, in reducing the height of the electro-optical column of electron optics system 300A and in reducing the structural complexity thereof. In some embodiments, an aperture plate (e.g., a gun aperture plate) (not shown) may be placed between electron source 301 and source conversion unit 320 to block off peripheral electrons of primary electron beam 302 before being incident on source conversion unit 320, to reduce Coulomb interaction effects.

Source conversion unit 320 may comprise aperture lens array 322, as illustrated in FIGS. 3A and 3B. In some embodiments, aperture lens array 322 may be implemented via a plate comprising a plurality of apertures. In some embodiments, aperture lens array 322 may be implemented via multiple partial plates comprising a plurality of apertures. Aperture lens array 322 may comprise aperture lenses 322_1, 322_2, and 322_3 configured to focus primary beamlets 311, 312, and 313, respectively, corresponding to a primary electron beam exiting electron source 301. In some embodiments, aperture lenses 322_1, 322_2, and 322_3 may comprise electrostatic lenses. Although FIG. 3A shows three aperture lenses, it is appreciated that aperture lens array 322 may comprise any number of aperture lenses. Aperture lens array 322 may be positioned immediately downstream of electron source 301.

In some embodiments, aperture lens array 322 may include an aperture-lens forming electrode plate 322-E-el and an aperture lens plate 322-ALP, as illustrated in FIG. 3B. The configurations of both aperture-lens forming electrode plate 322-E-el and aperture lens plate 322-ALP may provide aperture lenses 322_1, 322_2, and 322_3 of aperture lens array 322. In some embodiments, aperture lens such as 322_1 may be formed as a result of an electric field generated between aperture-lens forming electrode plate 322-E-el and aperture lens plate 322-ALP. In some embodiments, forming aperture lenses 322_1, 322_2, and 322_3 may include generating electric fields above and below aperture lens plate 322-ALP. The electric field above aperture lens plate 322-ALP may be generated between aperture-lens forming electrode plate 322-E-el and aperture lens plate 322-ALP, and electric field below aperture lens plate 322-ALP may be generated between aperture lens plate 322-ALP and beam-limit aperture array 321. The electric fields above and below aperture lens plate 322-ALP may be different in magnitude so that a lens field is formed in each aperture of aperture lens plate 322-ALP, thereby forming aperture lenses 322_1, 322_2, and 322_3 of aperture lens array 322.

In some embodiments, aperture-lens forming electrode plate 322-E-el may be configured as an electrically conducting structure comprising an opening or an aperture configured to allow passage of electrons of primary electron beam 302. As an example, the electrically conducting structure may include a plate or multiple plates arranged to form the aperture configured to allow the electrons to pass through. Aperture-lens forming electrode plate 322-E-el may be positioned immediately downstream of electron source 301 and orthogonal to primary optical axis 304 along which primary electron beam 302 propagates. The geometric center of the aperture of aperture-lens forming electrode plate 322-E-el may be aligned with primary optical axis 304.

In some embodiments, the aperture of aperture-lens forming electrode plate 322-E-el may be configured to allow a portion of the electrons of primary electron beam 302 to pass through, for example, by employing an aperture size smaller than the cross-sectional diameter of primary electron beam 302 or by increasing the distance between aperture-lens forming electrode plate 322-E-el and electron source 301. In some embodiments, the aperture of aperture-lens forming electrode plate 322-E-el may be configured to allow primary electron beam 302 to pass through without filtering or blocking electrons.

In some embodiments, aperture-lens forming electrode plate 322-E-el may be connected via a connector (not illustrated) with a controller (e.g., controller 50 of FIG. 2). The controller may be configured to supply a voltage V1 to aperture-lens forming electrode plate 322-E-el. Controller 50 may also be configured to maintain or adjust the supplied voltage V1 to aperture-lens forming electrode plate 322-E-el.

In some embodiments, aperture lens plate 322-ALP may be positioned downstream or immediately downstream of aperture-lens forming electrode plate 322-E-el and may be orthogonal to primary optical axis 304. In other words, in this configuration, aperture-lens forming electrode plate 322-E-el may be positioned between electron source 301 and aperture lens plate 322-ALP. In some embodiments, aperture lens plate 322-ALP may be configured as an electrically conducting structure with a plurality of apertures that are traversed by primary electron beam 302. The electrically conducting structure may be implemented by a single plate with a plurality of apertures or a plurality of plates arranged to form a plurality of apertures.

In some embodiments, aperture lens plate 322-ALP may be connected via a connector (not illustrated) with controller 50 which may be configured to supply a voltage V2 to aperture lens plate 322-ALP. Controller 50 may also be configured to maintain or adjust the supplied voltage V2 to aperture lens plate 322-ALP. In configurations where aperture lens plate 322-ALP comprises a plurality of plates, each of the plurality of plates may be maintained at the same voltage V2. It is appreciated, though not preferred in this example, that the plurality of plates may be supplied different voltages, based on the application.

In some embodiments, voltage V1 applied to aperture-lens forming electrode plate 322-E-el may be different from voltage V2 applied to aperture lens plate 322-ALP to generate an electric field E1, which may enable aperture-lens forming electrode plate 322-E-el and aperture lens plate 322-ALP to form a plurality of aperture lenses of aperture lens array 322. In such a configuration, each of the plurality of apertures of aperture lens plate 322-ALP which is maintained at a voltage V2, functions as an electrostatic lens configured to focus primary beamlets 311, 312, and 313. In other words, aperture lens array 322 may function as a focusing lens or an array of focusing lenses when a non-zero electric field E1 exists between aperture-lens forming electrode plate 322-E-el and aperture lens plate 322-ALP.

The relative values of voltages V1 and V2 may determine whether the electrons of primary electron beam 302 are accelerated or decelerated while traversing aperture lens array 322. Exemplary values of voltages V1 and V2 may be in the range of 0-20 KV. Although, it is appreciated that the values of voltages V1 and V2 may vary based on, including but not limited to, extraction voltages, desired landing energy of primary beamlets 311, 312, and 313, size of the probe spots, material being inspected, etc.

In some embodiments, each beamlet exiting the corresponding aperture lens in the aperture lens array 322 at the aperture lens plate 322-ALP may be collimated to be a parallel beam, as shown in FIG. 3B. In some embodiments, each beamlet exiting the corresponding aperture lens in the aperture lens array 322 may not be a parallel beam, as shown in FIG. 3C. The imaging magnification, of the system 300C of FIG. 3C, from virtual source 303 to intermediate image plane PI may be smaller than the imaging magnification of the system 300B of FIG. 3B. In some embodiments, this magnification can be optimized based on the virtual source 303 size, the required spot size on sample 308, and the limitation on full system length from the virtual source 303 to the sample 308. In some embodiments primary beamlets 311, 312, and 313 may be convergent or divergent based on the magnitudes of electric fields influencing their path. For example, if E1>E2, the beamlets may be convergent or parallel and if E1<E2, the beamlets may be divergent.

In some embodiments, beam-limit aperture array 321 may be configured to limit currents of primary beamlets 311, 312, and 313. In some embodiments, beam-limit aperture array 321 may be disposed downstream of aperture lens array 322 or immediately downstream of aperture lens plate 322-ALP and orthogonal to primary optical axis 304. In some embodiments, beam-limit aperture array 321 may be configured as an electrically conducting structure comprising a plurality of beam-limit apertures. Beam-limit aperture array 321 may be connected via a connector (not illustrated) with controller 50 which may be configured to supply a voltage V3 to beam-limit aperture array 321. Controller 50 may also be configured to maintain or adjust the supplied voltage V3 to beam-limit aperture array 321.

In some embodiments, voltage V3 applied to beam-limit aperture array 321 may be similar or substantially similar to voltage V2 applied to aperture lens plate 322-ALP such that no electric field or a negligible electric field E2 exists between aperture lens plate 322-ALP and beam-limit aperture array 321. In the context of this disclosure, negligible electric field may be referred to as the maximum value of the electric field below which no lensing effect exists between aperture lens plate 322-ALP and beam-limit aperture array 321. Exemplary values of negligible electric field E2 may vary in the range of 0.01 to 0.05 KV/m. It is appreciated that the negligible electric field E2 values may be different based on other factors including, but not limited to, tool condition, calibration, complexity, etc. One of the numerous advantages of maintaining a zero or a negligible electric field E2 may be enhanced imaging resolution because the beam-limit aperture array may not generate aberrations.

In some embodiments, voltage V3 applied to beam-limit aperture array 321 may be dissimilar to voltage V2 applied to aperture lens plate 322-ALP such that there exists a non-zero electric field E2. In some embodiments, voltage V1 applied to aperture-lens forming electrode plate 322-E-el may be dissimilar to voltage V2 applied to aperture lens plate 322-ALP and voltage V3 applied to beam-limit aperture array 321.

In some embodiments, electric field E1 between aperture-lens forming electrode plate 322-E-el and aperture lens plate 322-ALP may be different in magnitude (E1≠E2) than electric field E2 between aperture lens plate 322-ALP and beam-limit aperture array 321. In such a configuration, a lensing effect exists in aperture lens array 322 such that each of the plurality of apertures of aperture lens plate 322-ALP functions as an electrostatic lens to focus the primary beamlets 311, 312, and 313. The magnitude of electric field E2 may be zero or a non-significant value such that no lensing effect exists between aperture lens plate 322-ALP and beam-limit aperture array 321, resultantly, allowing passage of primary beamlets 311, 312, and 313 through the beam-limit apertures with reduced aberrations.

The beamlet current or the probe current of primary beamlets 311, 312, and 313 generating probe spots 311S, 312S, and 313S, respectively, may be determined based on the sizes of the apertures of beam-limit aperture array 321 through which primary beamlets 311, 312, and 313 traverse through. In some embodiments, beam-limit aperture array 321 may comprise a plurality of beam-limit apertures having uniform sizes, shapes, cross-sections, or pitch. In some embodiments, the sizes, shapes, cross-sections, pitches, etc. may be non-uniform as well. The beam-limit apertures may be configured to limit the currents of beamlets by, for example, limiting the size of the beamlet or the number of electrons passing through the aperture based on the size or shape of the apertures.

In some embodiments, beam-limit aperture array 321 may be movable along an x-axis and a y-axis in a plane orthogonal to primary optical axis 304 such that primary beamlets 311, 312, and 313 may be incident upon apertures of a desired shape and size. For example, beam-limit aperture array 321 may comprise a plurality of rows of apertures having a shape and a size, wherein apertures within each row have similar sizes and shapes. The position of beam-limit aperture array 321 may be adjusted so that a row of apertures having the desired sizes and shapes may be exposed to primary beamlets 311, 312, and 313.

Source conversion unit 320 may comprise imaging lens 324 configured to focus primary beamlets 311, 312, and 313 on an image plane PI, as illustrated in FIG. 3B. Imaging lens 324 may have a principal plane 324_2 orthogonal to primary optical axis 304. In some embodiments, imaging lens 324 may be positioned downstream of beam-limit aperture array 321 or immediately downstream of beam-limit aperture array 321. Imaging lens 324 may be configured to focus primary beamlets 311, 312, and 313 to form focused plurality of images of primary electron beam 302 on the intermediate image plane PI.

In some embodiments, imaging lens 324 may be movable within a range of positions along primary optical axis 304, as illustrated in FIG. 3B. The position of image plane PI may be adjusted by, for example, changing the focal power of imaging lens 324. The focal power of imaging lens 324 may be adjusted by varying the electrical excitation, for example, by varying the voltage or the current applied to imaging lens 324. In some embodiments, imaging lens 324 may be an electrostatic lens or a magnetic lens. It is appreciated that imaging lens 324 may be an electromagnetic lens, or a compound lens as well.

In some embodiments, the position of principal plane 324_2 of imaging lens 324 or imaging lens 324 may be adjusted to change the pitch of probe spots 311S, 312S, and 313S on the surface of sample 308. In some embodiments, position of sample 308 along primary optical axis 304 may be changed to change the pitch of probe spots 311S, 312S, and 313S. In some embodiments, position of principal plane 324_2 of imaging lens 324 and position of sample 308 along primary optical axis 304 may be changed to change the pitch of probe spots 311S, 312S, and 313S.

Objective lens 331 of electron optics system 300B may be configured to focus primary beamlets 311, 312, and 313 onto the surface of sample 308 for inspection and can form probe spots 311S, 312S, and 313S, respectively, on surface of sample 308. As illustrated in FIG. 3B, objective lens 331 may be positioned on a principal plane 331_2 and may be configured to be adjustable within a range of positions. In some embodiments, objective lens 331 may be configured to determine the final size of beamlets incident on sample 308 and reduce aberrations of probe spots formed thereon. In some embodiments, the position of the principal plane 324_2 of imaging lens 324, or the position of principal plane 331_2 of objective lens 331, or position of the sample 308 may be adjusted along primary optical axis 304 to adjust the pitch of the probe spots 311S, 312S, and 313S.

As shown in FIGS. 3D and 3E, in response to incidence of probe spots 311S, 312S, and 313S of primary beamlets 311, 312, and 313 on sample 308, electrons may emerge from sample 308 and form three secondary electron beams 311se, 312se, and 313se respectively corresponding to probe spots 311S, 312S and 313S. In some embodiments, electron system 300D and 300E may include a beam separator 334 to separate the secondary electron beams 311se, 312se, and 313se from the primary beamlets 311, 312, and 313, and direct the secondary electron beams towards a secondary imaging system (such as the secondary imaging system 250 in FIG. 2).

As explained above with respect to FIG. 2, the beam separator 334 may be of Wien filter type comprising an electrostatic deflector generating an electrostatic dipole field and a magnetic dipole field. In some embodiments, the electrostatic force exerted by the electrostatic dipole field on the electrons of primary beamlets 311, 312, and 313 is equal in magnitude and opposite in direction to the magnetic force exerted on the electrons by the magnetic dipole field. Accordingly, the primary beamlets 311, 312, and 313, which travel towards the sample 308, can pass straight through the beam separator 334 with zero deflection angles. In contrast, the secondary electron beams 311se, 312se, and 313se, which are emerged from the sample 308 and travel away from the sample 308, may be deflected away from the primary beamlets 311, 312 and 313 and towards the secondary imaging system.

The magnetic force exerted on one electron depends on the velocity of the electron. Electrons of primary electron beam 302 may be different in energy or velocity, hence the magnetic forces exerted on electrons of each of beamlets 311, 312 and 313 may not be same. Accordingly, some electrons of each beamlet may have different non-zero deflection angles. Hence beam separator 334 generates a dispersion to beamlets 311, 312 and 313. If the dispersion does not happen at a focusing plane of beamlets 311, 312 and 313 (e.g., an image plane of source 303), its influence enlarges probe spots 311S, 312S and 313S on sample 308. In some embodiments, the beam separator 334 therefore may be positioned on the image plane PI. Consequently, the size increasement of the probe spots 311S, 312S, and 313S caused by the dispersion generated by the beam separator 334 may be substantially reduced or even fully eliminated.

As shown in FIG. 3D, the beam separator 334 may be included in an electron optics system in which each of the primary beamlets 311, 312, and 313 is a parallel beam (such as the system 300B in FIG. 3B). As shown in FIG. 3E, the beam separator 334 may be included in an electron optics system in which each of the primary beamlets 311, 312, and 313 is not a parallel beam (such as the system 300C in FIG. 3C).

Reference is now made to FIGS. 4A-4D, which illustrate exemplary configurations of electron optics systems 400A-400D, respectively, consistent with the embodiments of the present disclosure. In addition to the elements of electron optics systems 300A-300C of FIGS. 3A-3C, respectively, electron optics systems 400A-400D comprise a transfer lens 433. Electron source 401, source conversion unit 420 comprising aperture lens array 422, beam-limit aperture array 421, imaging lens 424, and objective lens 431 may be similar or substantially similar to the corresponding elements of electron optics systems 300A-300C and may perform similar functions.

In some embodiments, it may be desirable to focus primary beamlets 411, 412, and 413 and form a crossover on a front focal plane of objective lens 431 so that primary beamlets 411, 412, and 413 land perpendicularly on sample 408. Focusing primary beamlets 411, 412, and 413 and forming a crossover on the front focal plane of objective lens 431 may be accomplished by, for example, adjusting the focal power of imaging lens 424 via adjusting the electrical excitation.

Figure 4A:
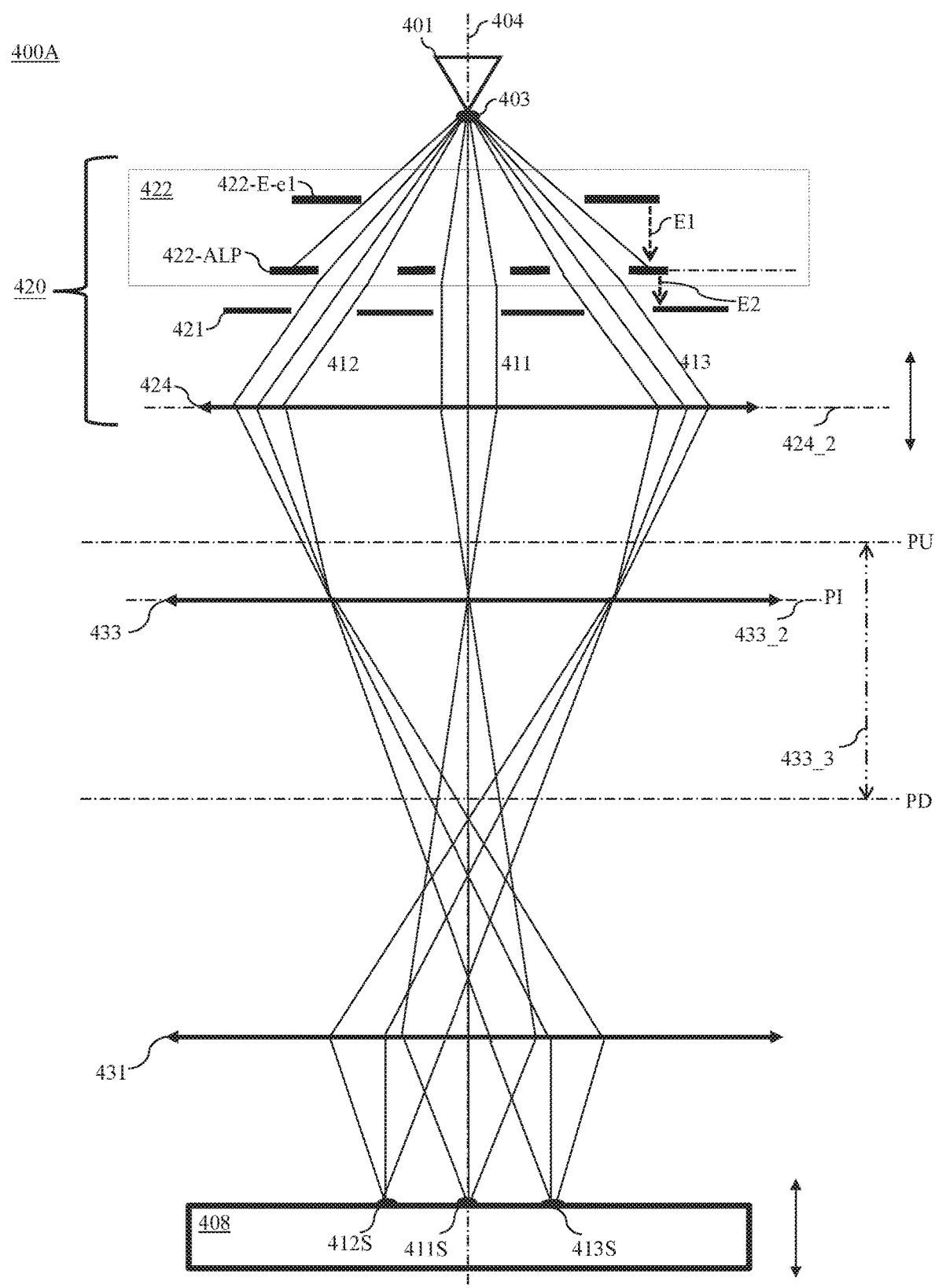
FIGS. 4A-4D are schematic diagrams illustrating exemplary configurations of an electron optics system in a multi-beam apparatus, consistent with embodiments of the present disclosure.

In some embodiments, a transfer lens 433 may be used to direct primary beamlets 411, 412, and 413 to form a crossover on a front focal plane of objective lens 431 in electron optics system 400A, as shown in FIG. 4A. Accordingly, primary beamlets 411, 412, and 413 can normally or substantially normally land on sample 408 and the plurality of probe spots 411S, 412S, and 413S may be formed with small aberrations.

In some embodiments, transfer lens 433 may be a stationary lens or a movable lens (principal plane movable along optical axis 404). Transfer lens 433 may, for example, be an electrostatic, magnetic, or electromagnetic compound lens. Magnetic or electrostatic fields generated by the lens may be varied by adjusting the electric excitation of the lens, e.g., to change the focusing power of the lens. Transfer lens 433 may be disposed downstream of imaging lens 424 or immediately downstream of imaging lens 424. Transfer lens 433 may have a principal plane 433_2 orthogonal to primary optical axis 404 that coincides with image plane (PI). In some embodiments, aperture lens array 422 and imaging lens 424 may be configured to focus primary beamlets 411, 412, and 413 to form a plurality of real images of electron source 401 on image plane (PI). In this example, image plane (PI) may coincide with principal plane 433_2 of transfer lens 433. In the context of this disclosure, "coincide" may include on or near the planes. As used herein, "near" may refer to the physical proximity of image plane (PI) and principal plane 433_2 of transfer lens 433. For example, image plane (PI) may be formed within a proximal distance of principal plane 433_2 so that transfer lens 433 does not focus primary beamlets 411, 412, and 413, but may only bend primary beamlets 411, 412, and 413 towards optical axis 404.

In some embodiments, the pitch of probe spots 411S, 412S, and 413S may be determined based on the position of image plane (PI) and the position of principal plane 433_2 of transfer lens 433 along primary optical axis 404. The pitch of probe spots 411S, 412S, and 413S may increase as image plane (PI) and principal plane 433_2-move away from imaging lens 424. For example, the pitch of the probe spots is larger when image plane (PI) and principal plane 433_2 are positioned farther from imaging lens 424 along primary optical axis 404 than when positioned closer to imaging lens 424 along primary optical axis 404. The positions of these two planes may be adjustable along primary optical axis 404 in a range of positions, represented by 433_3 in FIG. 4A, shown as the upper and the lower positions of principal plane 433_2 (designated as PU and PD, respectively). In other words, PU indicates the position of principal plane 433_2 within the range of positions closer to imaging lens 424 than objective lens 431, and PD indicates the position of principal plane 433_2 within the range of positions closer to objective lens 431 than imaging lens 424.

FIG. 4A illustrates electron optics system 400A with principal plane 433_2 of transfer lens 433 positioned closer to PU or closer to imaging lens 424, thereby resulting in a small pitch of probe spots 411S, 412S, and 413S. In such a configuration, the electrical excitation of imaging lens 424 may be adjusted so that image plane (PI) is coincident or near principal plane 433_2 of transfer lens 433.

Figure 4B:
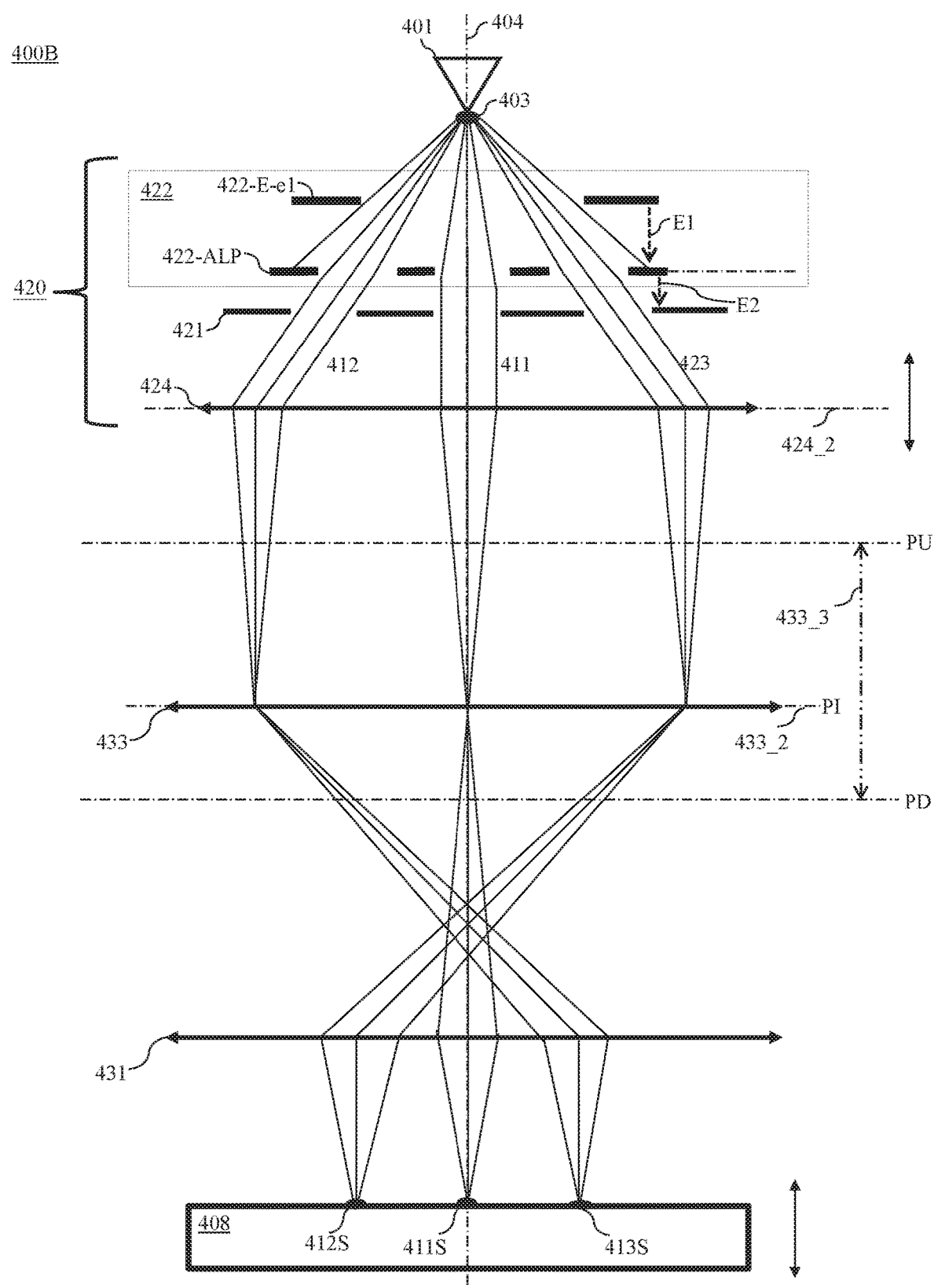

FIG. 4B illustrates electron optics system 400B with a moderate pitch of probe spots 411S, 412S, and 413S. In such a configuration, primary beamlets 411, 412, and 413 may be parallel or substantially parallel to primary optical axis 404 after exiting imaging lens 424.

Figure 4C:
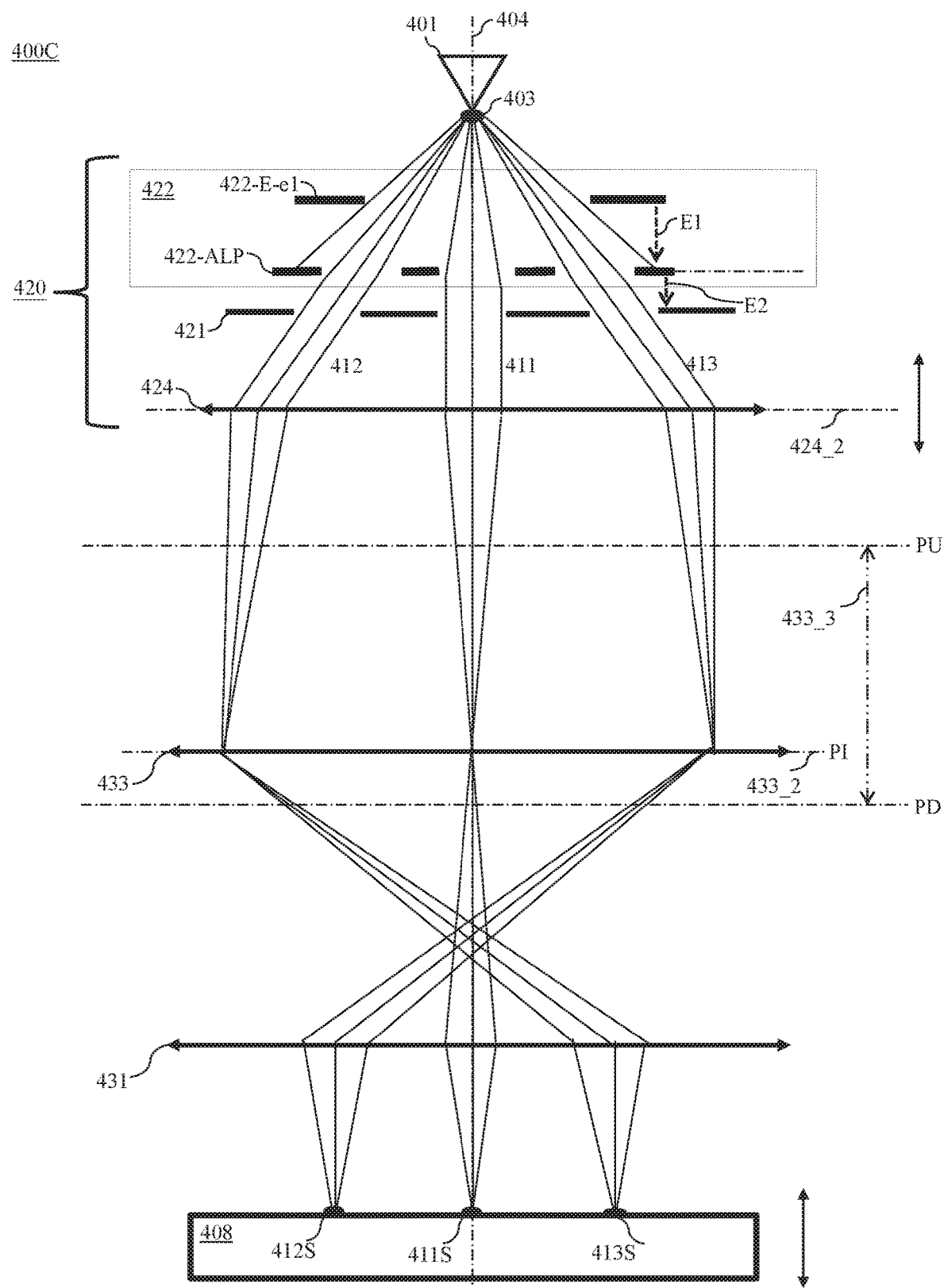

FIG. 4C illustrates electron optics system 400C with principal plane 433_2 of transfer lens 433 positioned closer to objective lens 431 than imaging lens 424, thereby resulting in a larger pitch of probe spots 411S, 412S, and 413S. In this example, imaging lens 424 may be further configured to weakly focus primary beamlets 412 and 413 such that primary beamlets 411, 412, and 413 are focused on image plane (PI) coincident with or near principal plane 433_2. As shown in FIG. 4C, image plane (PI) and principal plane 433_2 are coincident and near PD of movable range 433_3 of transfer lens 433.

Figure 4D:
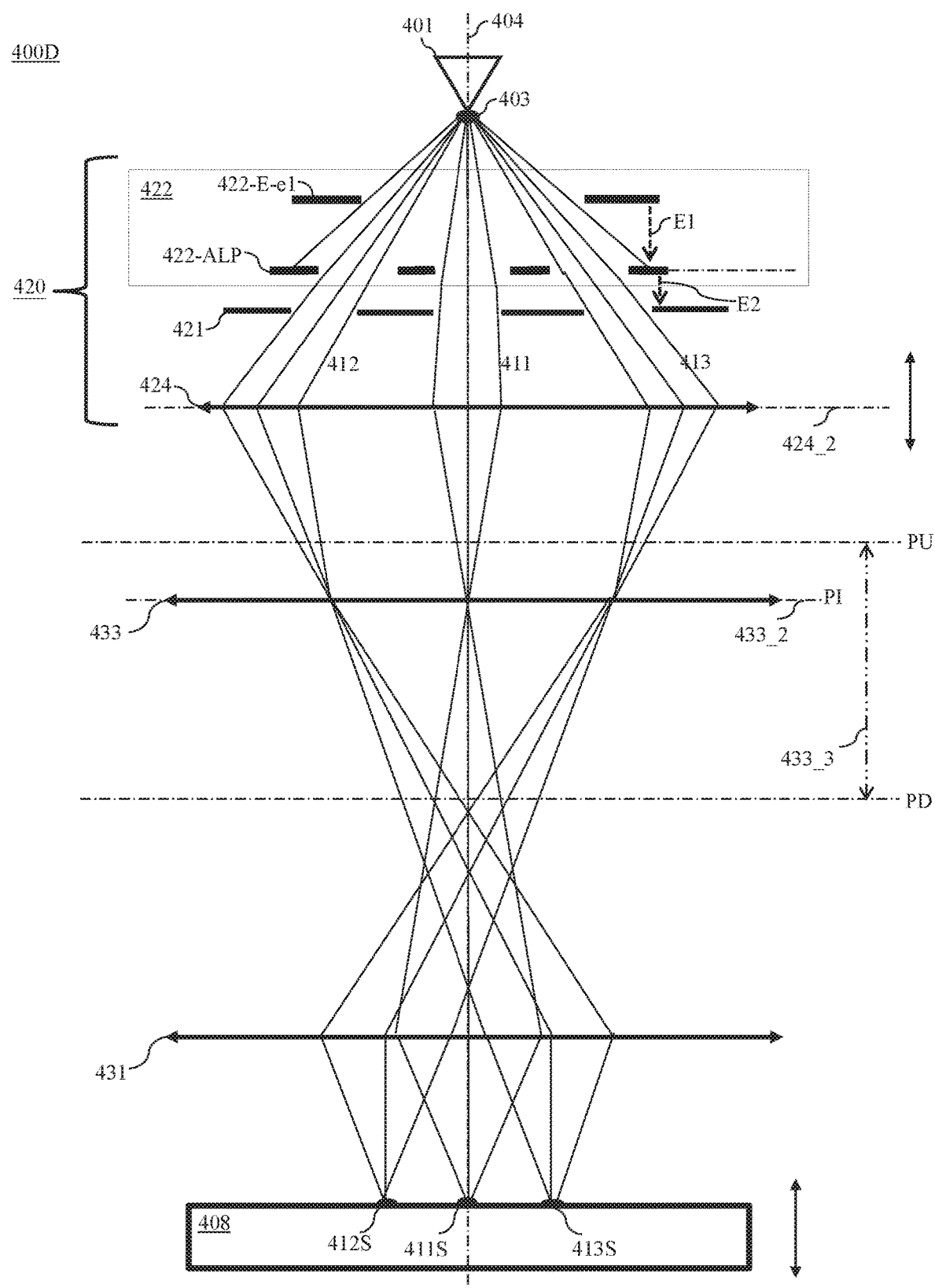

As shown in FIGS. 4A, 4B, and 4C, in some embodiments, each beamlet exiting the corresponding aperture lens in the aperture lens array 422 at the aperture lens plate 422-ALP may be collimated to be a parallel beam, similar to electron optics system 300B of FIG. 3B. In some embodiments, as shown in FIG. 4D, each beamlet exiting the corresponding aperture lens in the aperture lens array 422 may not be parallel beam (e.g., may be diverging or converging), similar to system 300C of FIG. 3C.

Figure 5A:
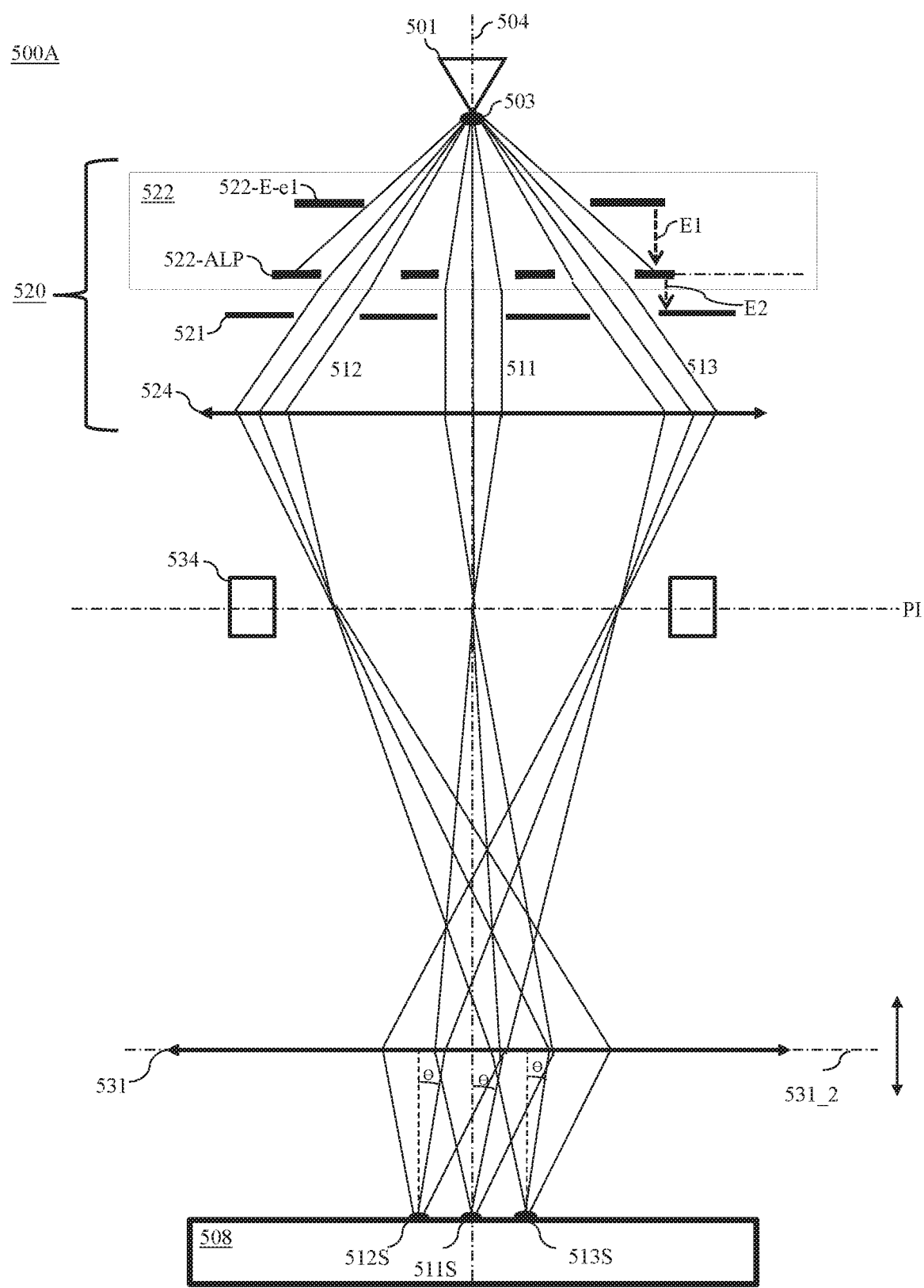
FIGS. 5A and 5B are schematic diagrams illustrating an exemplary configuration of an electron optics system in a multi-beam apparatus with tilting angles of incident beamlets on sample surface, consistent with embodiments of the present disclosure.
Figure 5B:
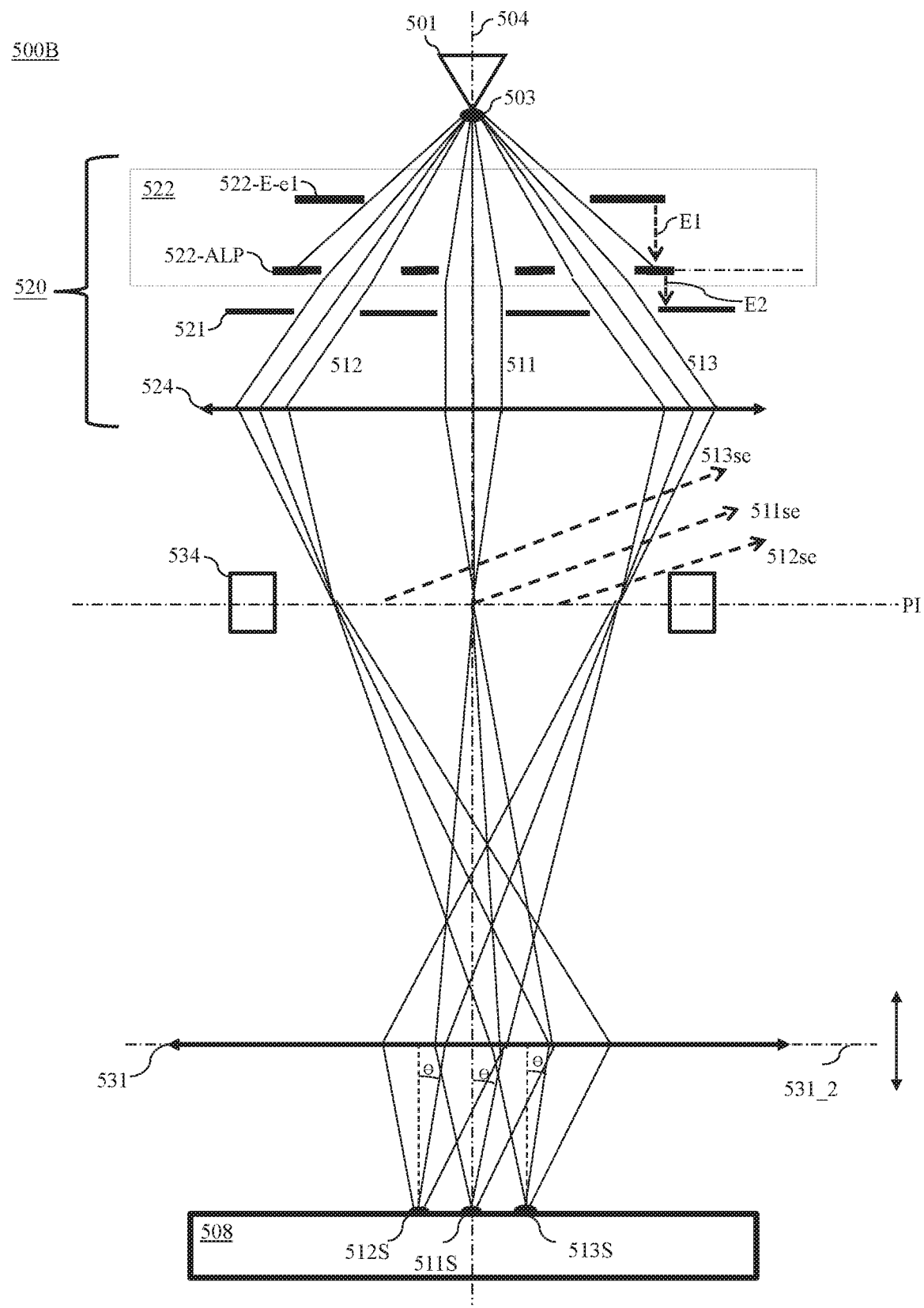

Reference is now made to FIGS. 5A and 5B, which illustrate an exemplary configuration of electron optics system 500A and 500B in a multi-beam apparatus, consistent with embodiments of the present disclosure. In addition to the elements of electron optics system such as 300B of FIG. 3B, electron optics system 500A comprises a beamlet tilting deflector 534. Electron source 501, source conversion unit 520 comprising aperture lens array 522, beam-limit aperture array 521, imaging lens 524, and objective lens 531 may be similar or substantially similar to the corresponding elements of electron optics system 300B of FIG. 3B and may perform similar functions.

Integrated circuit (IC) devices often comprise multiple layers of three-dimensional structures patterned on a substrate such as a silicon wafer using techniques for thin-film deposition, etching, or other commonly known fabrication techniques for micro-electromechanical systems. During in-line process inspection of the wafer, it may be desirable to inspect, for example, the side walls of a via, a trench, or a mesa structure for defects. In some embodiments, such as electron optics system 300B, and 400A-400D, landing angles (angles formed with the normal of sample surface) of probing beamlets are zero or approximately zero and may not be suitable to perform the task of inspecting, for example, side walls of a trench or a mesa.

To address this issue, electron optics system 500A may include beamlet tilting deflector 534, as illustrated in FIG. 5A. Beamlet tilting deflector 534 may comprise an electrostatic deflector, or a magnetic deflector or an electromagnetic deflector and may be placed such that a deflection plane of beam tilting deflector 534 may be coincident with image plane (PI) formed by imaging lens 524. In some embodiments, beamlet tilting deflector 534 may be configured to tilt primary beamlets 511, 512, and 513 to obliquely land on the surface of sample 508 with same or substantially same landing angles (Θ) with respect to the surface normal of sample 508. Beamlet tilting deflector 534 may be placed between source conversion unit 520 and objective lens 531.

In some embodiments, if beamlet tilting deflector 534 is energized, it may deflect primary beamlets 511, 512, and 513 together to land with same or substantially same landing angles on surface of sample 508. Tilting the beamlets may include shifting the crossover of primary beamlets 511, 512, and 513 slightly off primary optical axis 504, as illustrated in FIG. 5A, and on or near the front focal plane of objective lens 531. If beamlet tilting deflector 534 is de-energized, primary beamlets 511, 512, and 513 may be incident normally or substantially normally on sample 508. The tilting angles or landing angles of primary beamlets 511, 512, and 513 may be adjusted based on the electrical excitation of beamlet tilting deflector 534.

As shown in FIG. 5B, in some embodiments, the beamlet tilting deflector 534 may also function as a beam separator (such as the beam separator 334 of FIGS. 3D and 3E) that separates the secondary electron beams 511se, 512se, and 513se from the primary beamlets 511, 512, and 513. In some embodiments, the beamlet tilting deflector 534 (that also functions as a beam separator) may be positioned on the image plane PI. The size increasement of the probe spots 511S, 512S, and 513S caused by the dispersion generated by the beamlet tilting deflector 534 may be substantially reduced or even fully eliminated by positioning the beamlet tilting deflector 534 on the image plane PI.

Figure 6A:
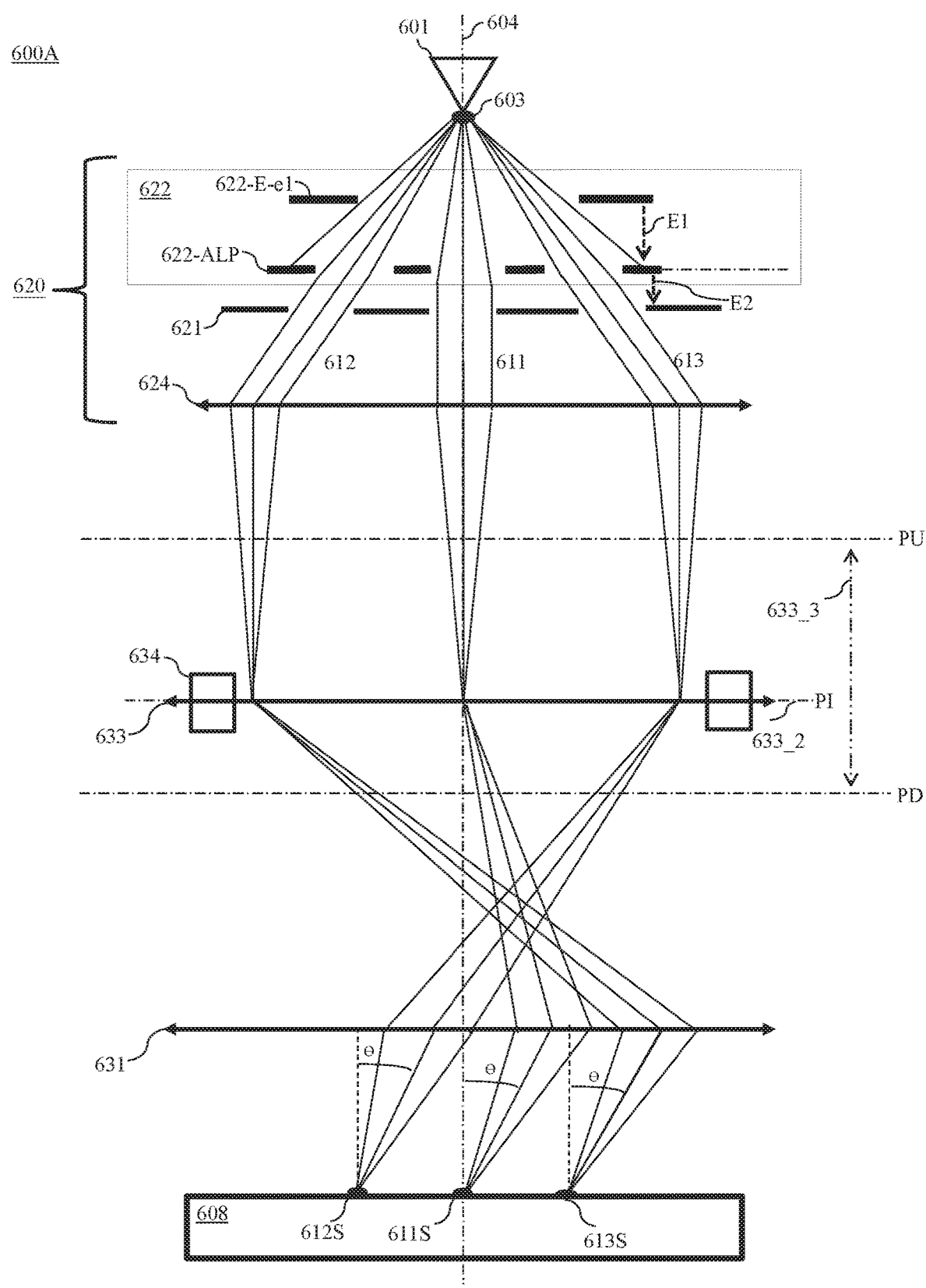
FIGS. 6A-6C are schematic diagrams illustrating exemplary configurations of an electron optics system in a multi-beam apparatus, consistent with embodiments of the present disclosure.
Figure 6B:
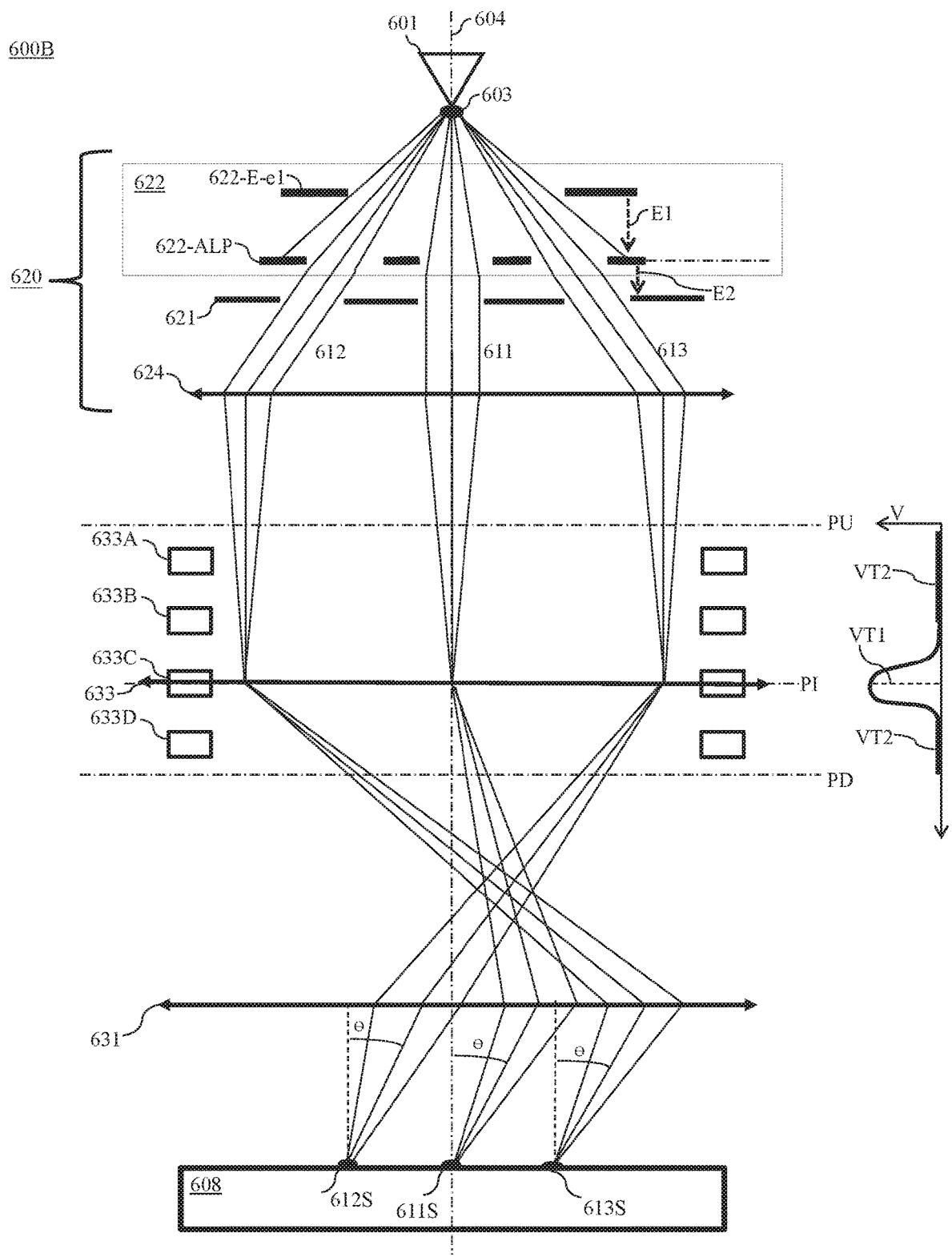
Figure 6C:
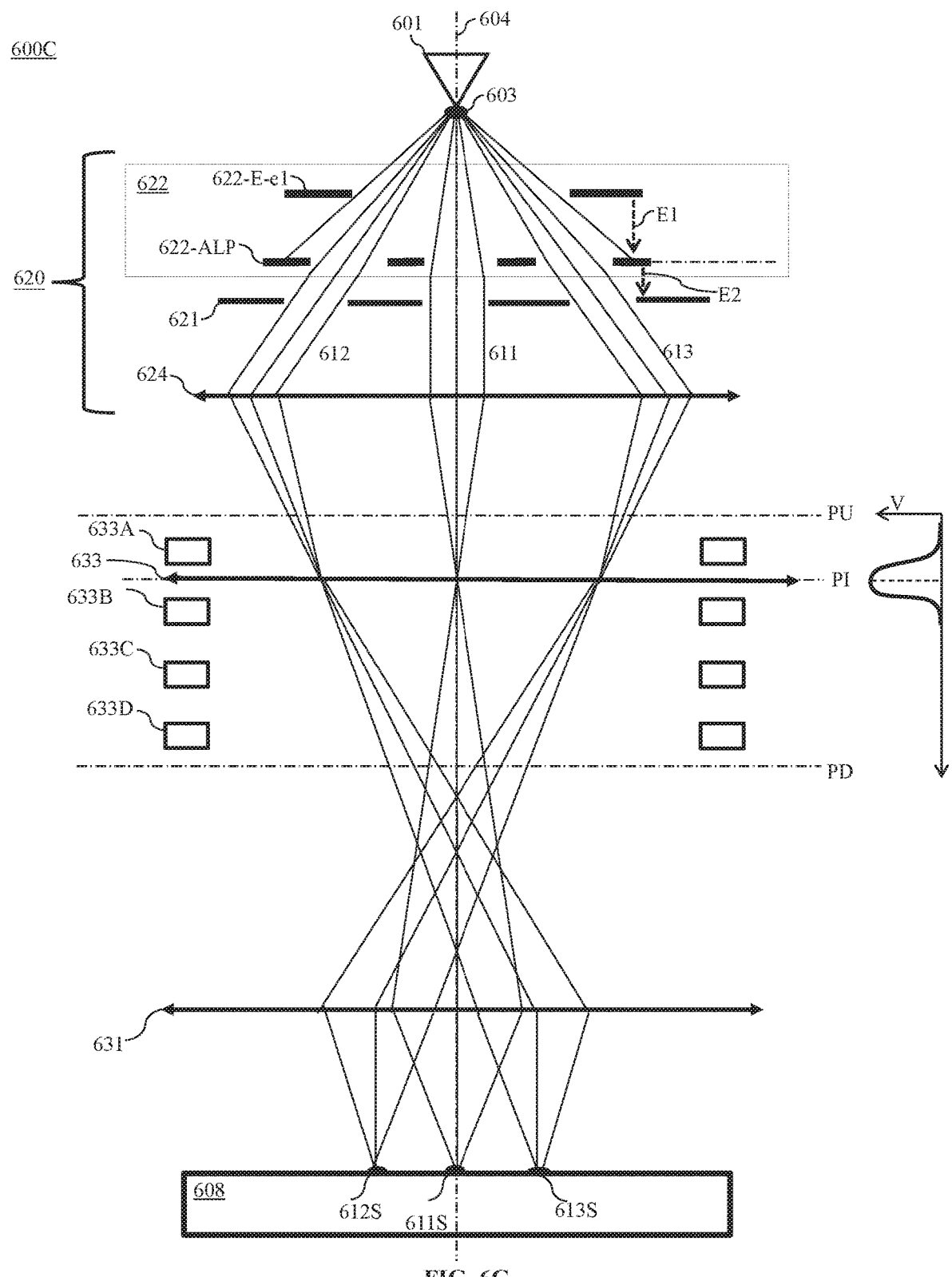

Reference is now made to FIGS. 6A-6C, which illustrate exemplary configurations of electron optics systems 600A-600C, respectively, consistent with embodiments of the present disclosure. In addition to the elements of electron optics system 500A of FIG. 5A, electron optics systems 600A-600C may comprise transfer lens 633. It should be noted that electron source 601, source conversion unit 620 comprising aperture lens array 622, beam-limit aperture array 621, imaging lens 624, objective lens 631, and beamlet tilting deflector 634 may be similar or substantially similar to the corresponding elements of electron optics systems 500A and may perform similar functions. Transfer lens 633 may be similar or substantially similar to transfer lens 433 of electron optics systems 400A-400C and may perform similar functions.

FIG. 6A illustrates electron optics system 600A, which may combine the benefits of using a transfer lens and a beamlet tilting deflector in a multi-beam inspection apparatus, as described in relation to FIGS. 4A-4C and FIG. 5A, respectively. Although, in some embodiments, beamlet-tilting deflector 634 may be placed closer to source conversion unit 620, beamlet-tilting deflector 634 may be preferably positioned such that the deflection plane coincides with principal plane 633_2 of transfer lens 633. In some embodiments, as illustrated in FIG. 6A, deflection plane of beamlet-tilting deflector 634 and principal plane 633_2 may coincide with image plane (PI) and may be located within a range of positions 633_3 for transfer lens 633 along primary optical axis 604.

In FIG. 6A, aperture lens array 622 and imaging lens 624 focus primary beamlets 611, 612, and 613 to form a plurality of real images of electron source 601 on an intermediate image plane (PI), which coincides with principal plane 633_2 of transfer lens 633. In some embodiments, the image plane (PI) may be near principal plane 633_2 of transfer lens 633. Beamlet-tilting deflector 634 may also be placed on or near image plane (PI). In this configuration, the tilting angles may be changed by adjusting the electrical excitation of beamlet-tilting deflector 634 while the pitch of probe spots 611S, 612S, and 613S may be changed by adjusting the position of principal plane 633_2 and image plane (PI) together along primary optical axis 604.

In some embodiments (such as those illustrated in FIGS. 6B and 6C), transfer lens 633 may comprise a plurality of electrodes 633A, 633B, 633C, and 633D. Although only four electrodes are illustrated in FIGS. 6B and 6C, it is appreciated that transfer lens 633 may comprise any number of electrodes, as appropriate. In some embodiments, electrodes 633A, 633B, 633C, and 633D may be positioned along an optical axis (not shown) of transfer lens 633, which coincides with primary optical axis 604. Electrodes 633A, 633B, 633C, and 633D may be implemented via a multi-pole structure. In FIG. 6B, transfer lens 633 comprises two outer electrodes, 633A and 633D, and two inner electrodes, 633B and 633C. The electrodes may be separated from each other by a uniform distance or a non-uniform distance. The distance between electrodes may be useful in determining the electric field within transfer lens 633 or between two or more electrodes.

In some embodiments, transfer lens 633 may be connected via a connector with a controller (e.g., controller 50). Controller 50 may be configured to apply a voltage to electrodes 633A, 633B, 633C, and 633D, and maintain or adjust the applied voltage based on the requirements. A voltage VT1 may be applied to one or more electrodes (e.g., electrodes 633A, 633B, 633C, and 633D) while voltage VT2 is applied to the remaining electrodes to generate an electric field within transfer lens 633. The electric field may be generated close to image plane (PI) formed by imaging lens 624 so that principal plane 633_2 is coincident with or close to image plane (PI).

An exemplary configuration of electrodes 633A, 633B, 633C, and 633D of transfer lens 633 in electron optics system 600B is illustrated in FIG. 6B Similar to electron optics system 600A of FIG. 6A, electron optics system 600B comprises transfer lens 633 and beamlet tilting deflector 634 (not shown). As an example, in FIG. 6B, image plane (PI) is placed to generate probe spots 611S, 612S, and 613S having a moderate pitch, and primary beamlets 411, 412, and 413 may be parallel or substantially parallel to primary optical axis 404 after exiting imaging lens 624. The pitch of the probe spots may be adjusted, for example, by adjusting the electrical excitation of imaging lens 624 to change the position of image plane (PI). If the position of image plane (PI) is closer to objective lens 631 than imaging lens 624, the pitch of the probe spots may be larger (as illustrated in electron optics system 400C of FIG. 4C).

As shown in FIG. 6B, voltage VT1 may be applied to inner electrode 633C while voltage VT2 may be applied to inner electrode 633B, and outer electrodes 633A and 633D. VT1 and VT2 may be different from each other. In some embodiments, VT1 and VT2 may both be non-zero voltages. In this example, the electric field is generated within transfer lens 633 such that principal plane 633_2 is coincident or near image plane (PI).

FIG. 6C illustrates electron optics system 600C, in which the position of image plane (PI) is closer to imaging lens 624 than objective lens 631 to generate probe spots 611S, 612S, and 613S having a smaller pitch compared to the embodiment of 600B. In this scenario, a voltage difference may exist between electrodes 633A and 633B while electrodes 633C and 633D may be held at the same voltage as electrode 633B. This configuration may create an electric field between electrodes 633A and 633B such that principal plane 633_2 of transfer lens 633 is coincident or near image plane (PI). In some embodiments, transfer lens 633 may be configured to direct primary beamlets 611, 612, and 613 towards the front focal plane of objective lens 631, and a beamlet-tilting deflector may not be necessary. As shown in FIG. 6C, in the absence of beamlet-tilting deflector 634, primary beamlets 611, 612, and 613 may land normally or substantially normally on the surface of sample 608 with zero tilting or landing angles.

Figure 7A:
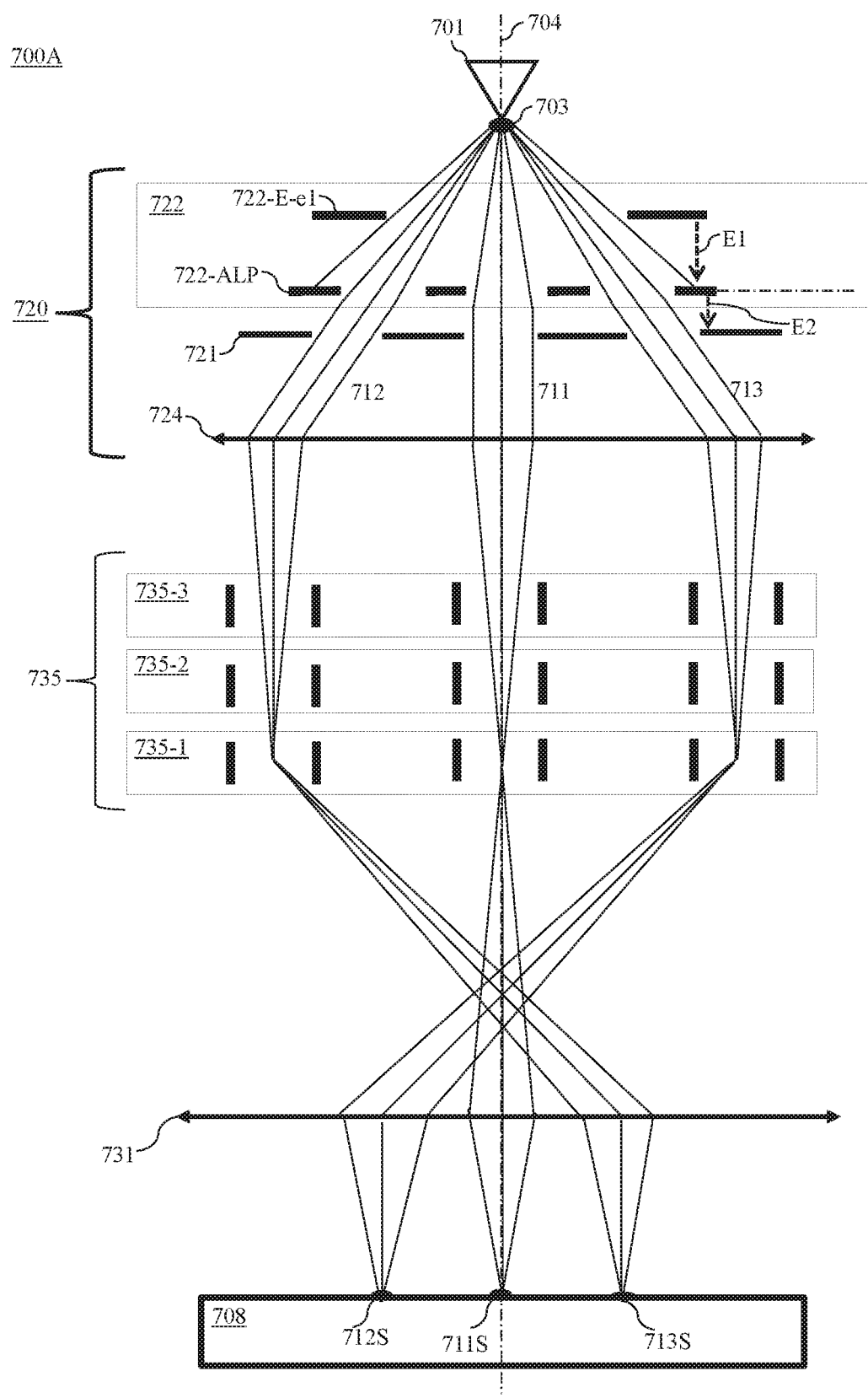
FIGS. 7A and 7B are schematic diagrams illustrating an exemplary configuration of an electron optics system in a multi-beam apparatus, consistent with embodiments of the present disclosure.
Figure 7B:
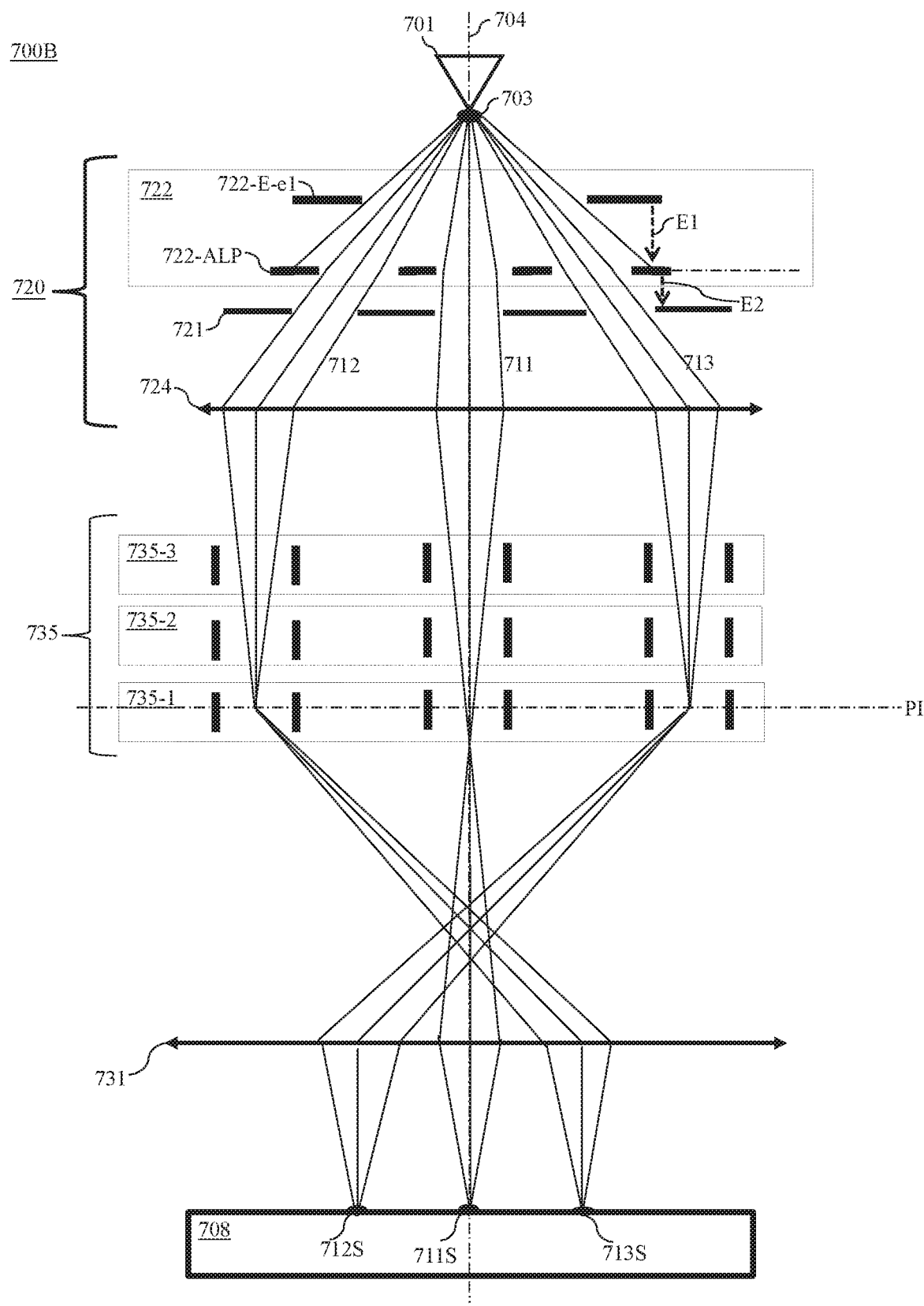

Reference is now made to FIGS. 7A and 7B, which illustrate an exemplary configuration of an electron optics system 700A and 700B in a multi-beam inspection apparatus, consistent with embodiments of the present disclosure. In addition to the elements of electron optics system 300B and 300C of FIGS. 3B and 3C, electron optics system 700A and 700B may comprise a beamlet adjustment unit 735. Electron source 701, source conversion unit 720 comprising aperture lens array 722, beam-limit aperture array 721, imaging lens 724, and objective lens 731 may be similar or substantially similar to the corresponding elements of electron optics system 300B and 300C and may perform similar functions.

As shown in FIG. 7A, in some embodiments, each beamlet exiting the corresponding aperture lens in the aperture lens array 722 at the aperture lens plate 722-ALP may be collimated to be parallel beam, similar to electron optics system 300B of FIG. 3B. In some embodiments, as shown in FIG. 7B, each beamlet exiting the corresponding aperture lens in the aperture lens array 722 may not be parallel beam (e.g., may be diverging or converging), similar to system 300C of FIG. 3C. Each beamlet may be parallel or substantially parallel to primary optical axis 704 after exiting imaging lens 724. The imaging magnification from virtual source 703 to intermediate image plane PI may be larger than that in FIG. 7A. This magnification can be optimized based on the virtual source 703 size, the required spot size on sample 708 and the limitation on full system length from virtual source 703 to sample 708.

Electron optics system 700A and 700B may comprise a beamlet adjustment unit 735. In some embodiments beamlet adjustment unit 735 may comprise a deflector array 735_1, a field curvature compensator array 735_2, and an astigmatism compensator array 735_3. Field curvature compensator array 735_3 may comprise a plurality of micro-lenses to compensate field curvature aberrations of the primary beamlets 211, 212, and 213. Astigmatism compensator array 735_2 may comprise a plurality of micro-stigmators to compensate astigmatism aberrations of the primary beamlets 211, 212, and 213.

In some embodiments, primary beamlets 711, 712, and 713 may be directed from source conversion unit 720 to beamlet adjustment unit 735 to compensate for field curvature and astigmatism aberrations to improve focus of beamlets at probe spots 711S, 712S, and 713S.

In some embodiments, beamlet adjustment unit 735 may be placed between source conversion unit 720 and objective lens 731. In one configuration of beamlet adjustment unit 735, astigmatism compensator array 735_3 may be placed immediately downstream of source conversion unit 720, field curvature compensator array 735_2 may be placed immediately downstream of astigmatism compensator array 735_3, and deflector array 735_1 may be placed immediately downstream of field curvature compensator array 735_2, as shown in FIGS. 7A and 7B. It is appreciated that other arrangements of astigmatism compensator array 735_3, field curvature compensator array 735_2, and deflector array 735_1 within beamlet adjustment unit 735 may be employed as well.

In some embodiments, deflector array 735_1 may be positioned such that a deflection plane of deflector array 735_1 may coincide or is near image plane (PI) (not shown) formed by imaging lens 724 of source conversion unit 720. Deflector array 735_1 may comprise a plurality of micro-deflectors configured to enable deflection of beamlets towards optical axis 704. For example, the micro-deflectors may individually adjust the deflection angle of a beamlet such that primary beamlets 711, 712, and 713 may form a crossover at the front focal plane of objective lens 731. In some embodiments, the primary beamlets may be enabled to land normally or substantially normally on sample 708 or form plurality of probe spots 711S, 712S, and 713S with small aberrations. In some embodiments, the pitch of probe spots 711S, 712S, and 713S may be determined, for example, based on the position of the principal plane of imaging lens 724, or the position of principal plane of objective lens 731, or the position of sample 708 along primary optical axis 704. The position of image plane (PI) may be adjusted based on the electrical excitation of imaging lens 724.

The deflection angles of the deflected beamlets may be set based on one or more criteria. In some embodiments, deflectors may deflect off-axis beamlets radially outward or away (not illustrated) from primary optical axis 704. In some embodiments, deflectors may be configured to deflect off-axis beamlets radially inward or towards primary optical axis 704. Deflection angles of the beamlets may be set so that beamlets 711, 712, and 713 land perpendicularly on sample 708. Off-axis aberrations of images due to lenses, such as objective lens 731, may be reduced by adjusting paths of the beamlets passing through the lenses. Therefore, deflection angles of off-axis beamlets 712 and 713 may be set so that probe spots 712S and 713S have small aberrations. Beamlets may be deflected to make beamlets 711, 712, and 713 land perpendicularly on sample 708. In some embodiments, deflectors may be set to make probe spots 711S, 712S, and 713S have small aberrations. In some embodiments, deflectors may be set to make beamlets 711, 712, and 713 land substantially perpendicularly on sample 708 while probe spots 711S, 712S, and 713S have small aberrations. In some embodiments, deflector array 735_1 may be configured to deflect primary beamlets 711, 712, and 713 to pass through the front focal plane of objective lens 731 at places off primary optical axis 704 so that primary beamlets 711, 712, and 713 may land on the surface of sample 708 at tilted angles with respect to the surface normal of sample 708. In some embodiments, the tilted angles of primary beamlets 711, 712, and 713 may be individually varied based on the inspection requirements. For example, the tilted angles of primary beamlets 711, 712, and 713 may be similar, or substantially similar, or different.

In some embodiments, field curvature compensator array 735_2 may comprise a plurality of micro-lenses configured to compensate for the field curvature of probe spots 711S, 712S, and 713S. In some embodiments, field curvature compensator array 735_2 may comprise multiple layers of a plurality of micro-lenses. Field curvature compensator array 735_2 may be positioned between astigmatism compensator array 735_3 and deflector array 735_1 of beamlet adjustment unit 735. Examples of a multi-layer array are further described in U.S. Patent Application No. 62/567,134, which is incorporated herein in its entirety.

In some embodiments, astigmatism compensator array 735_3 may comprise a plurality of micro-stigmators configured to compensate for the astigmatism of plurality of probe spots 711S, 712S, and 713S. Each micro-stigmator may be configured to generate a quadrupole field to compensate for the astigmatism of the corresponding primary beamlet. In some embodiments, astigmatism compensator array 735_3 may comprise multiple layers of a plurality of micro-stigmators.

In some embodiments, although not illustrated in FIG. 7A or 7B, electron optics system 700A and 700B may comprise a transfer lens (e.g., transfer lens 633 of FIG. 6A) or a beamlet tilting deflector (e.g., beamlet tilting deflector 634 of FIG. 6A). The beamlet tilting deflector may be placed such that the deflection plane of the beamlet tilting deflector coincides or is near the deflection plane of deflector array 735_1. The beamlet tilting deflector may be configured to deflect primary beamlets 711, 712, and 713 such that a crossover thereof is formed slightly off primary optical axis 704 and primary beamlets 711, 712, and 713 land at the surface of sample 708 at a tilted angle with respect to the surface normal of sample 708. In some embodiments, transfer lens may be placed such that the principal plane of the transfer lens coincides with the deflection plane of deflector array 735_1 and the image plane (PI). In some embodiments, the transfer lens may be placed below deflector array 735_1 so that the pitches of probe spots 711S, 712S, and 713S can be changed by adjusting focusing power or position of the principal plane of the transfer lens.

Figure 8:
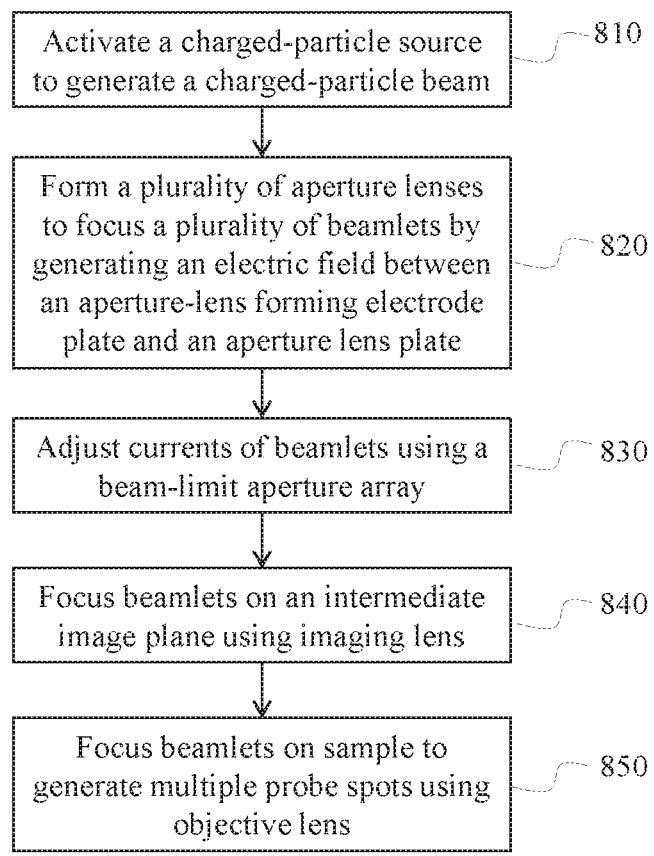
FIG. 8 is a process flowchart representing an exemplary method of inspecting a sample using multiple beams in an electron optics system, consistent with embodiments of the present disclosure.

Reference is now made to FIG. 8, which illustrates a flowchart representing an exemplary method 800 of inspecting a sample using multiple beams in an electron optics system, consistent with embodiments of the present disclosure. Method 800 may be performed by controller 50 of EBI system 100, as shown in FIG. 1, for example Controller 50 may be programmed to perform one or more blocks of method 800. For example, controller 50 may apply a first voltage to an aperture-lens forming electrode plate and carry out other functions.

In step 810, a charged particle source (e.g., electron source 301 of FIG. 3B) may be activated to generate a charged particle beam (e.g., primary electron beam 302 of FIG. 3B). The electron source may be activated by a controller (e.g., controller 50 of FIG. 1). For example, the electron source may be controlled to emit primary electrons to form an electron beam along a primary optical axis (e.g., primary optical axis 304 of FIG. 3B). The electron source may be activated remotely, for example, by using a software, an application, or a set of instructions for a processor of a controller to power the electron source through a control circuitry.

In step 820, a plurality of primary electron beamlets (e.g., primary beamlets 311, 312, and 313 of FIG. 3A) may be focused by a plurality of aperture lenses (e.g., aperture lenses 322_1, 322_2, and 322_3 of FIG. 3A) of an aperture lens array (e.g., aperture lens array 322 of FIG. 3A). The aperture lenses may be formed by creating an electric field E1 between an aperture-lens forming electrode plate (e.g., aperture-lens forming electrode plate 322-E-el of FIG. 3B) and an aperture lens plate (e.g., aperture lens plate 322-ALP of FIG. 3B).

In some embodiments, the aperture-lens forming electrode plate may comprise an electrically conducting structure having an opening or an aperture configured to allow passage of primary electron beam. As an example, the electrically conducting structure may include a plate or multiple plates arranged to form the aperture configured to allow the electrons to pass through. In some embodiments, aperture-lens forming electrode plate may be positioned immediately downstream of the electron source and orthogonal to the primary optical axis along which primary electron beam propagates.

In some embodiments, the aperture lens plate may comprise an electrically conducting structure with a plurality of apertures which are traversed by the primary electron beam. The electrically conducting structure may be implemented by a single plate with a plurality of apertures or a plurality of plates arranged to form a plurality of apertures. The aperture lens plate may be positioned immediately downstream of aperture-lens forming electrode plate and orthogonal to the primary optical axis.

In some embodiments, the aperture-lens forming electrode plate and the aperture plate may be connected with the controller to supply a voltage V1 and V2, respectively. The controller may also be configured to maintain or adjust the supplied voltages. The controller may maintain a potential difference, for example, by applying different voltages V1 and V2, between the aperture-lens forming electrode plate and the aperture lens plate to generate an electric field E1. In the presence of the electric field E1, each of the apertures of the aperture lens plate may function as an electrostatic lens, thereby forming the aperture lens array. The aperture lenses of the aperture lens array may be configured to focus the beamlets traversing the aperture lens plate.

In step 830, the currents of the primary electron beamlets exiting the aperture lens plate may be adjusted by passing through a current limiting aperture array (e.g., beam-limit aperture array 321 of FIG. 3B). The beam-limit aperture array may be disposed immediately downstream of the aperture lens plate and orthogonal to the primary optical axis. In some embodiments, the beam-limit aperture array may be implemented by an electrically conducting structure comprising a plurality of beam-limit apertures.

In some embodiments, the beam-limit aperture array may be connected with the controller to supply a voltage V3 that is same or substantially same as V2, such that a negligible electric field E2 exists between the beam limit aperture array and the aperture lens plate. Maintaining a negligible, preferably zero, electric field E2 may enable the primary electron beamlets to pass through the beam-limit aperture array without experiencing any lensing effect. One of the advantages of maintaining a zero, or a near-zero electric field E2 between the beam-limit aperture array and the aperture lens plate may be reduced aberrations, thereby enhancing the imaging resolution.

The beam-limit aperture array may comprise apertures of uniform or non-uniform sizes, cross-sections, shapes, and pitches. The beam-limit aperture array may be movable along a plane perpendicular to the primary optical axis such that the primary electron beamlets traversing the beam-limit aperture array may pass through apertures of desired sizes and shapes. The size of the primary electron beamlet may determine the number of electrons, thereby determining the current of the beamlet.

In step 840, the primary electron beamlets exiting the beam-limit aperture array may be focused on an intermediate image plane (e.g., image plane PI of FIG. 3B) using an imaging lens (e.g., imaging lens 324 of FIG. 3B). In some embodiments, the imaging lens may be positioned immediately downstream of the beam-limit aperture array and configured to focus the primary electron beamlets on the intermediate image plane PI.

In some embodiments, the position of the image plane PI along the primary optical axis may be adjusted by changing the focal power of the imaging lens. The focal power of the imaging lens may be changed by adjusting the electrical excitation by supplying a voltage or a current to the imaging lens. The imaging lens may be connected with the controller to apply the desired electrical excitation to change the position of the image plane PI along the primary optical axis based on a desired pitch of the plurality of probe spots (e.g., probe spots 311S, 312S, and 313S of FIG. 3B). The primary electron beamlets may be directed by the imaging lens to pass through a front focal plane of the objective lens.

In some embodiments, such as embodiments illustrating exemplary configurations of electron optics systems 400A-400C, a transfer lens (e.g., transfer lens 433 of FIG. 4A) may be disposed between the imaging lens and the objective lens. The transfer lens may be configured to direct the primary electron beamlets to pass through the front focal plane of objective lens. In some embodiments, the transfer lens may be a stationary lens or a movable lens. Transfer lens may, for example, be an electrostatic, magnetic, or electromagnetic compound lens. Magnetic or electrostatic fields generated by the lens may be varied by adjusting the electric excitation of the lens, e.g., to change a focusing power of the lens or change a position of a principal plane of the lens. The transfer lens may be connected with the controller to adjust the electrical excitation.

In some embodiments, the transfer lens may be positioned such that a principal plane (e.g., principal plane 433_2 of FIG. 4A) of the transfer lens coincides or is near the image plane PI. The position of the principal plane may be movable within a range of positions along the primary optical axis based on the electrical excitation of the transfer lens. It may be desirable to adjust the position of the principal plane of the transfer lens to coincide with the image plane PI to vary the pitch of the probe spots.

The pitches of the probe spots may increase with an increase in the distance of principal plane from the imaging lens. For example, the pitch of the probe spots is larger when the principal plane is positioned farther from the imaging lens along the primary optical axis than when the principal plane is positioned closer to the imaging lens along the primary optical axis.

In some embodiments, such as the embodiment of 500A, a beamlet tilting deflector (e.g., beamlet tilting deflector 534 of FIG. 5A) may be placed between the imaging lens and the objective lens to tilt the primary electron beamlets to obliquely land on the surface of the sample with same or substantially same landing angles (Θ) with respect to the surface normal of the sample. This may be useful in inspecting side walls of a mesa structure, or a via, or a trench during wafer inspection.

The beamlet tilting deflector may be positioned such that the deflection plane of the beam tilting deflector may be coincident or near image plane PI. In some embodiments, if the beamlet tilting deflector is energized, it may deflect the primary electron beamlets together to land with same or substantially same landing angles on surface of the sample. Tilting the beamlets may include shifting the crossover of the beamlets slightly off the primary optical axis, as illustrated in FIG. 5A, and near the front focal plane of the objective lens. If beamlet tilting deflector is de-energized, the primary electron beamlets may be incident normally or substantially normally on the sample. The tilting angles or landing angles of the primary electron beamlets may be adjusted based on the electrical excitation of the beamlet tilting deflector which may be connected with the controller. The controller may be configured to supply the electrical excitation desired to adjust the tilting angle by the beamlet tilting deflector.

In some embodiments, such as the embodiments of 600A-600C, the electron optics systems may include the transfer lens and the beamlet tilting deflector. In such systems, the pitch of the probe spots may be adjusted based on the positions of the principal plane of the imaging lens, or the principal plane of the transfer lens, or the principal plane of the objective lens, or the sample, while tilting the primary electron beamlets using the beamlet tilting deflector.

In some embodiments, such as the embodiment of 700A and 700B, the electron optics system may include a beamlet adjustment unit (e.g., beamlet adjustment unit 735 of FIGS. 7A and 7B) to compensate for the field curvature, astigmatism, and reducing aberrations of the probe spots. For example, the beamlet adjustment unit may comprise an astigmatism compensator array (e.g., astigmatism compensator array 735_3 of FIGS. 7A and 7B), a field curvature compensator array (e.g., field curvature compensator array 735_2 of FIGS. 7A and 7B), and a deflector array (e.g., a deflector array 735_1 of FIGS. 7A and 7B). The primary electron beamlets may be directed from the source conversion unit (e.g., source conversion unit 720 of FIGS. 7A and 7B) to the beamlet adjustment unit which deflect the primary electron beamlets to reduce the aberrations and compensate for astigmatism and field curvature to improve focus of the probe spots.

In some embodiments, the beamlet adjustment unit may be placed between source conversion unit and the objective lens. In one configuration of beamlet adjustment unit, the astigmatism compensator array may be placed immediately downstream of the source conversion unit, the field curvature compensator array may be placed immediately downstream of the astigmatism compensator array, and the deflector array may be placed immediately downstream of the field curvature compensator array. It is appreciated that other arrangements of the elements of the beamlet adjustment unit may be possible as well.

In some embodiments, the deflector array may be positioned such that a deflection plane of the deflector array may coincide or is near the image plane PI formed by the imaging lens. The deflector array may comprise a plurality of micro-deflectors configured to enable deflection of beamlets towards the objective lens. For example, the micro-deflectors may individually adjust the deflect angle of a primary electron beamlet such that it lands on the sample normally or with a tilted angle or has small aberrations on the sample. In some embodiments, the field curvature compensator array may comprise a plurality of micro-lenses configured to compensate for the field curvature of the probe spots. In some embodiments, the astigmatism compensator array may comprise a plurality of micro-stigmators configured to compensate for the astigmatism of plurality of the probe spots. In some embodiments, the astigmatism compensator array may comprise multiple layers of a plurality of micro-stigmators. In some embodiments, the field curvature compensator array may comprise multiple layers of a plurality of micro-lenses. In some embodiments, the deflector array may comprise multiple layers of a plurality of micro-deflectors. Micro-deflectors may have different pole numbers, and examples are further described in U.S. Patent Application No. 62/787,157, which is incorporated herein in its entirety.

In step 850, the primary electron beamlets may be focused and projected on a surface of the sample (e.g., sample 308 of FIG. 3A) by the objective lens to generate the probe spots. The objective lens may be configured to determine the final spot size of the probe spots by focusing and reducing aberrations of the primary electron beamlets. The objective lens may be movable along the primary optical axis to determine the pitch of the probe spots. In some embodiments, each of the primary electron beamlets may form a probe spot on the sample. The primary electron beamlets may be incident normal to the sample surface. The primary electrons of the beamlets incident on the sample may generate secondary electrons. The secondary electrons may be detected using a secondary electron detector or a back-scattered electron detector, thus revealing information about the sample being probed.

The embodiments may further be described using the following clauses:

1. A charged particle beam apparatus to inspect a sample, the apparatus comprising:
   a charged particle source configured to emit a charged particle beam along a primary optical axis;
   a source conversion unit comprising:
   an aperture-lens forming electrode plate configured to be at a first voltage;
   an aperture lens plate configured to be at a second voltage that is different from the first voltage for generating a first electric field, which enables the aperture-lens forming electrode plate and the aperture lens plate to form a plurality of aperture lenses of an aperture lens array to respectively focus a plurality of beamlets of the charged particle beam; and
   an imaging lens configured to focus the plurality of beamlets on an image plane; and
   an objective lens configured to focus the plurality of beamlets onto a surface of the sample and form a plurality of probe spots thereon.

2. The charged particle beam apparatus of clause 1, wherein the imaging lens has a principal plane perpendicular to the primary optical axis.

3. The charged particle beam apparatus of any one of clauses 1 and 2, wherein the principal plane of the imaging lens is movable along the primary optical axis.

4. The charged particle beam apparatus of any one of clauses 1-3, wherein the objective lens has a principal plane perpendicular to the primary optical axis.

5. The charged particle beam apparatus of any one of clauses 1-4, wherein the principal plane of the objective lens is movable along the primary optical axis.

6. The charged particle beam apparatus of any one of clauses 1-5, wherein the sample is movable along the primary optical axis.

7. The charged particle beam apparatus of any one of clauses 4-6, wherein a pitch of the plurality of probe spots can be changed by moving at least one of the principal plane of the imaging lens, the principal plane of the objective lens, or the sample.

8. The charged particle beam apparatus of any one of clauses 1-7, wherein the source conversion unit further comprises a beam-limit aperture array configured to limit currents of the plurality of beamlets.

9. The charged particle beam apparatus of clause 8, wherein the beam-limit aperture array is disposed in and is movable in a plane perpendicular to the primary optical axis.

10. The charged particle beam apparatus of any one of clauses 8 and 9, wherein the beam-limit aperture array comprises a plurality of beam limiting apertures, and at least two beam limiting apertures of the plurality of beam limiting apertures are dissimilar in size.

11. The charged particle beam apparatus of any one of clauses 8-10, wherein the beam-limit aperture array is configured to be at a third voltage for generating a second electric field between the aperture lens plate and the beam-limit aperture array.

12. The charged particle beam apparatus of any one of clauses 1-11, wherein the aperture-lens forming electrode plate is positioned between the charged particle beam source and the aperture lens plate.

13. The charged particle beam apparatus of any one of clauses 1-12, wherein the aperture-lens forming electrode plate comprises an opening configured to allow passage of a portion of the charged particle beam.

14. The charged particle beam apparatus of any one of clauses 1-13, wherein the first electric field is uniform between the aperture-lens forming electrode plate and the aperture lens plate.

15. The charged particle beam apparatus of any one of clauses 1-14, wherein the aperture lens plate is positioned downstream of the aperture-lens forming electrode plate.

16. The charged particle beam apparatus of any one of clauses 1-15, wherein the aperture lens plate comprises a plurality of apertures configured to form the plurality of aperture lenses.

17. The charged particle beam apparatus of clause 16, wherein each of the plurality of aperture lenses comprises an electrostatic lens.

18. The charged particle beam apparatus of any one of clauses 11-17, wherein a magnitude of the first electric field is different from a magnitude of the second electric field, thereby forming a lens field corresponding to each aperture lens of the plurality of aperture lens of the aperture lens array.

19. The charged particle beam apparatus of any of clauses 11-18, wherein the third voltage is similar to the second voltage such that the second electric field is zero.

20. The charged particle beam apparatus of any one of clauses 11-18, wherein the first, the second, and the third voltage are dissimilar.

21. The charged particle beam apparatus of any one of clauses 11-20, wherein each of the plurality of aperture lenses is configured to collimate the corresponding beamlet to be a parallel beam.

22. The charged particle beam apparatus of clause 21, wherein each of the plurality of aperture lenses is configured by adjusting at least one of the first, second, and third voltages.

23. The charged particle beam apparatus of any one of clauses 1-22, further comprising a beam separator to deflect a plurality of secondary beams towards a secondary imaging system, wherein the plurality of secondary beams are emerged from the sample due to incidence of the plurality of beamlets of the charged particle beam.

24. The charged particle beam apparatus of clause 23, wherein the beam separator is positioned such that a deflection plane of the beam separator coincides with the image plane.

25. The charged particle beam apparatus of any one of clauses 1-24, further comprising a transfer lens having a principal plane perpendicular to the primary optical axis.

26. The charged particle beam apparatus of clause 25, wherein the transfer lens is disposed downstream of the imaging lens.

27. The charged particle beam apparatus of any one of clauses 25 and 26, wherein the principal plane of the transfer lens is moveable within a range of positions along the primary optical axis.

28. The charged particle beam apparatus of any one of clauses 25-27, wherein the transfer lens is positioned at a distance from the imaging lens such that a position of the principal plane of the transfer lens coincides with the image plane.

29. The charged particle beam apparatus of any one of clauses 25-28, wherein the transfer lens is configured to direct the plurality of beamlets from the image plane to the objective lens such that the plurality of beamlets normally land on the sample.

30. The charged particle beam apparatus of any one of clauses 25-29, wherein the transfer lens is configured to direct the plurality of beamlets to the objective lens such that the plurality of beamlets form the plurality of probe spots with small aberrations.

31. The charged particle beam apparatus of any one of clauses 28-30, wherein a pitch of the plurality of probe spots can be changed by moving the position of the principal plane of the transfer lens.

32. The charged particle beam apparatus of clause 31, wherein the apparatus is configured such that the pitch of the plurality of probe spots increases as the distance between the imaging lens and the principal plane of the transfer lens increases.

33. The charged particle beam apparatus of any one of clauses 1-32, further comprising a beamlet tilting deflector positioned downstream of the imaging lens.

34. The charged particle beam apparatus of clause 33, wherein the beamlet tilting deflector is positioned such that a deflection plane of the beamlet tilting deflector coincides with the image plane.

35. The charged particle beam apparatus of any one of clauses 33 and 34, wherein the beamlet tilting deflector is positioned between the imaging lens and the transfer lens.

36. The charged particle beam apparatus of any one of clauses 33-35, wherein the principal plane of the transfer lens is movable within the range of positions along the primary optical axis.

37. The charged particle beam apparatus of any one of clauses 34-36, wherein the deflection plane of the beamlet tilting deflector coincides with the principal plane of the transfer lens.

38. The charged particle beam apparatus of any one of clauses 34-37, wherein the deflection plane of the beamlet tilting deflector and the principal plane of the transfer lens coincide with the image plane.

39. The charged particle beam apparatus of any one of clauses 33-38, wherein the beamlet tilting deflector is configured to deflect the plurality of beamlets to be incident on the sample at a tilting angle in relation to a surface normal of the sample.

40. The charged particle beam apparatus of any one of clauses 33-39, wherein the beamlet tilting deflector comprises an electrostatic deflector or a magnetic deflector.

41. The charged particle beam apparatus of any one of clauses 39 and 40, wherein the tilting angle of the plurality of beamlets is adjusted based on electrical excitation of the beamlet tilting deflector.

42. The charged particle beam apparatus of any one of clauses 33-41, the beamlet tilting deflector is enabled to deflect the plurality of secondary beams towards the secondary imaging system.

43. The charged particle beam apparatus of any one of clauses 25-42, wherein the transfer lens comprises a plurality of electrodes disposed along an optical axis of the transfer lens and configured to enable generating a third electric field within the transfer lens.

44. The charged particle beam apparatus of clause 43, wherein the plurality of electrodes comprises an outer electrode and an inner electrode.

45. The charged particle beam apparatus of any one of clauses 43 and 44, wherein the optical axis of the transfer lens coincides with the primary optical axis.

46. The charged particle beam apparatus of any one of clauses 43-45, wherein the third electric field causes the principal plane of the transfer lens to coincide with the image plane.

47. The charged particle beam apparatus of any one of clauses 1-24, further comprising a beamlet adjustment unit positioned downstream of the imaging lens.

48. The charged particle beam apparatus of clause 47, wherein the beamlet adjustment unit comprises a deflector array configured to deflect at least some of the plurality of beamlets to enable the plurality of beamlets to be normally incident on the objective lens.

49. The charged particle beam apparatus of any one of clauses 47 and 48, wherein the beamlet adjustment unit comprises a field curvature compensator array configured to compensate for field curvature aberrations of the plurality of probe spots.

50. The charged particle beam apparatus of any one of clauses 47-49, wherein the beamlet adjustment unit comprises an astigmatism compensator array configured to compensate for astigmatism aberrations of the plurality of probe spots.

51. The charged particle beam apparatus of clause 50, wherein the deflector array is positioned downstream of the astigmatism compensator array and the field curvature compensator array.

52. The charged particle beam apparatus of any one of clauses 47-51, wherein the beamlet adjustment unit is configured to enable the plurality of beamlets to generate the plurality of probe spots with small aberrations.

53. The charged particle beam apparatus of any one of clauses 1-52, wherein the aperture lens array is implemented via a plate with a plurality of first apertures.

54. The charged particle beam apparatus of any one of clauses 1-53, wherein the aperture lens array is implemented via a plurality of plates comprising a plurality of second apertures.

55. The charged particle beam apparatus of any one of clauses 1-54, further comprising a gun aperture plate disposed between the aperture lens array and the charged particle beam source and configured to block peripheral charged particles of the charged particle beam.

56. A method of inspecting a sample using a charged particle beam apparatus, the method comprising:
   activating a charged particle source to generate a charged particle beam;
   focusing a plurality of beamlets of the charged particle beam, using a plurality of aperture lenses of an aperture lens array, the plurality of aperture lenses formed by generating a first electric field between an aperture-lens forming electrode plate and an aperture lens plate, wherein generating the first electric field comprises:
     applying a first voltage to the aperture-lens forming electrode plate; and
     applying a second voltage that is different from the first voltage to the aperture lens plate;
   focusing, using an imaging lens, the plurality of beamlets on an image plane; and
   focusing, using an objective lens, the plurality of beamlets on a surface of the sample to form a plurality of probe spots thereon.

57. The method of clause 56, further comprising adjusting, using a beam-limit aperture array, currents of the plurality of beamlets incident on the surface of the sample.

58. The method of clause 57, further comprising applying a third voltage to the beam-limit aperture array to generate a second electric field between the aperture lens plate and the beam-limit aperture array.

59. The method of clause 58, wherein a magnitude of the second electric field is different from a magnitude of the first electric field.

60. The method of any one of clauses 56-59, wherein a pitch of the plurality of probe spots may be adjusted based on a position of at least one of the imaging lens, the objective lens, or the sample, along a primary optical axis.

61. The method of any one of clauses 56-60, further comprising enabling each of the plurality of aperture lenses to collimate the corresponding beamlet to be a parallel beam.

62. The method of clause 61, wherein enabling each of the plurality of aperture lenses comprises adjusting at least one of the first, second, and third voltages.

63. The method of any one of clauses 56-62, further comprising deflecting, using a beam separator, a plurality of secondary beams towards a secondary imaging system, wherein the plurality of secondary beams are emerged from the sample due to incidence of the plurality of beamlets of the charged particle beam.

64. The method of clause 63, wherein the beam separator is positioned such that a deflection plane of the beam separator coincides with the image plane.

65. The method of any one of clauses 56-64, further comprising directing, using a transfer lens, the plurality of beamlets to the objective lens such that the plurality of beamlets is normally incident on the sample.

66. The method of clause 65, wherein directing the plurality of beamlets to the objective lens using the transfer lens generates the plurality of probe spots having small aberrations.

67. The method of any one of clauses 65 and 66, wherein the transfer lens is positioned at a distance from the imaging lens such that a position of a principal plane of the transfer lens coincides with the image plane.

68. The method of clause 67, further comprising adjusting a pitch of the plurality of probe spots by changing the position of the principal plane of the transfer lens in relation to the imaging lens along the primary optical axis.

69. The method of any one of clauses 67-68, further comprising generating a third electric field within the transfer lens to adjust the position of the principal plane of the transfer lens to coincide with the image plane.

70. The method of any one of clauses 56-65, further comprising deflecting, using a beamlet tilting deflector, the plurality of beamlets to be incident on the sample at a tilting angle in relation to a surface normal of the sample.

71. The method of clause 70, wherein the tilting angle of the plurality of beamlets is adjusted based on electrical excitation of the beamlet tilting deflector.

72. The method of any one of clauses 70 and 71, wherein the beam-tilting deflector is positioned such that a deflection plane of the beamlet tilting deflector coincides with the image plane.

73. The method of any one of clauses 70-72, further comprising enabling the beamlet tilting deflector to deflect the plurality of secondary beams towards the secondary imaging system.

74. The method of any one of clauses 56-65, further comprising deflecting, using a deflector array, at least some of the plurality of beamlets to enable the plurality of beamlets to be normally or substantially normally incident on the objective lens.

75. The method of clause 74, further comprising deflecting using the deflector array, at least some of the plurality of beamlets to enable the plurality of beamlets to generate the plurality of probe spots with small aberrations.

76. The method of any one of clauses 56-64 and 75, further comprising compensating, using a field curvature compensator array, for field curvature aberrations of the plurality of probe spots.

77. The method of any one of clauses 56-64 and 74-76, further comprising compensating, using an astigmatism compensator array, for astigmatism aberrations of the plurality of probe spots.

78. The method of any one of clauses 56-77, further comprising blocking, using a gun aperture plate, peripheral charged particles of the charged particle beam from being incident on the aperture-lens forming electrode plate.

79. A non-transitory computer readable medium storing a set of instructions that is executable by one or more processors of a charged particle beam apparatus to cause the charged particle beam apparatus to perform a method of inspecting a sample, the method comprising:

activating a charged particle source to generate a charged particle beam;

forming a plurality of aperture lenses of an aperture lens array to respectively focus a plurality of beamlets of the charged particle beam, wherein the plurality of beamlets are focused, using an imaging lens, on an imaging plane to form a plurality of images that are projected onto a surface of the sample to generate a plurality of probe spots.

80. The non-transitory computer readable medium of clause 79, wherein forming the plurality of aperture lenses of an aperture lens array comprises:

applying a first voltage to an aperture-lens forming electrode plate; and applying a second voltage to an aperture lens plate that is different from the first voltage so that a first electric field is generated between the aperture-lens forming electrode plate and the aperture lens plate.

81. The non-transitory computer readable medium of clause 80, wherein the set of instructions that is executable by one or more processors of a charged particle beam apparatus cause the charged particle beam apparatus to further perform:

applying a third voltage to a beam-limit aperture array to generate a second electric field between the aperture lens plate and the beam-limit aperture array.

82. The non-transitory computer readable medium of clause 81, wherein the set of instructions that is executable by one or more processors of a charged particle beam apparatus cause the charged particle beam apparatus to further perform:

positioning the beam-limit aperture array configured to limit currents of a plurality of beamlets of the charged particle beam.

83. The non-transitory computer readable medium of any one of clauses 78-82, wherein the set of instructions that is executable by one or more processors of a charged particle beam apparatus cause the charged particle beam apparatus to further perform:

positioning the imaging lens along a primary optical axis to form the plurality of images on the image plane.

84. A charged particle beam apparatus to inspect a sample, the apparatus comprising:

a charged particle source configured to emit a charged particle beam along a primary optical axis;

a source conversion unit comprising:

an aperture lens array configured to focus a plurality of beamlets of the charged particle beam; and an imaging lens configured to focus the plurality of beamlets on an image plane; and an objective lens configured to focus the plurality of beamlets onto a surface of the sample and form a plurality of probe spots thereon.

85. The charged particle beam apparatus of clause 84, wherein the source conversion unit further comprises a beam-limit aperture array configured to limit currents of the plurality of beamlets.

86. The charged particle beam apparatus of any one of clauses 84 and 85, wherein the aperture lens array comprises an aperture-lens forming electrode plate and an aperture lens plate.

87. The charged particle beam apparatus of clause 86, wherein:

the aperture-lens forming electrode plate is configured to be at a first voltage, the aperture lens plate is configured to be at a second voltage that is different from the first voltage for generating a first electric field between the aperture-forming lens electrode plate and the aperture lens plate, and wherein the first electric field enables the aperture-lens forming electrode plate and the aperture lens plate to form an aperture lens array comprising a plurality of aperture lenses.

A non-transitory computer readable medium may be provided that stores instructions for a processor of a controller (e.g., controller 50 of FIG. 1) to carry out image inspection, image acquisition, activating charged-particle source, applying voltage to aperture-lens forming electrode plate, applying voltage to aperture lens plate, applying voltage to electrodes of transfer lens, beamlet deflecting, beamlet tilting, adjusting the electrical excitation of imaging lens, moving the sample stage to adjust the position of the sample, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A charged particle beam apparatus to inspect a sample, the apparatus comprising:

a charged particle source configured to emit a charged particle beam along a primary optical axis;

a source conversion unit configured to convert the charged particle beam into a plurality of sub-beams to form a plurality of images of the charged particle source, the source conversion unit comprising:

an aperture-lens forming electrode plate configured to be at a first voltage;

an aperture lens plate configured to be at a second voltage that is different from the first voltage for generating a first electric field, which enables the aperture-lens forming electrode plate and the aperture lens plate to form a plurality of aperture lenses of an aperture lens array to respectively focus a plurality of beamlets of the charged particle beam;

a beam-limit aperture array positioned downstream of the aperture lens plate with respect to a path of the charged-particle beam and configured to limit beam currents of the plurality of beamlets exiting the aperture lens plate; and an imaging lens configured to focus the plurality of beamlets on an image plane; and an objective lens configured to focus the plurality of beamlets onto a surface of the sample and form a plurality of probe spots thereon.

2. The charged particle beam apparatus of claim 1, wherein the imaging lens has a principal plane perpendicular to the primary optical axis.

3. The charged particle beam apparatus of claim 2, wherein the principal plane of the imaging lens is movable along the primary optical axis.

4. The charged particle beam apparatus of claim 1, wherein the objective lens has a principal plane perpendicular to the primary optical axis.

5. The charged particle beam apparatus of claim 4, wherein the principal plane of the objective lens is movable along the primary optical axis.

6. The charged particle beam apparatus of claim 1, wherein the sample is movable along the primary optical axis.

7. The charged particle beam apparatus of claim 4, wherein a pitch of the plurality of probe spots can be changed by moving at least one of the principal plane of the imaging lens, the principal plane of the objective lens, or the sample.

8. The charged particle beam apparatus of claim 1, wherein the beam-limit aperture array is disposed in and is movable in a plane perpendicular to the primary optical axis.

9. The charged particle beam apparatus of claim 1, wherein the beam-limit aperture array comprises a plurality of beam limiting apertures, and at least two beam limiting apertures of the plurality of beam limiting apertures are dissimilar in size.

10. The charged particle beam apparatus of claim 1, wherein the beam-limit aperture array is further configured to be at a third voltage, and wherein the third voltage is adjustable with reference to the second voltage.

11. The charged particle beam apparatus of claim 1, wherein the aperture-lens forming electrode plate is positioned between the charged particle source and the aperture lens plate.

12. The charged particle beam apparatus of claim 1, wherein the aperture-lens forming electrode plate comprises an opening configured to allow passage of a portion of the charged particle beam.

13. The charged particle beam apparatus of claim 1, wherein the first electric field is uniform between the aperture-lens forming electrode plate and the aperture lens plate.

14. A non-transitory computer readable medium storing a set of instructions that is executable by one or more processors of a charged particle beam apparatus to cause the charged particle beam apparatus to perform a method of inspecting a sample, the method comprising:

activating a charged particle source to generate a charged particle beam;

forming a plurality of aperture lenses of an aperture lens array to respectively focus a plurality of beamlets of the charged particle beam by generating an electric field between an aperture-lens forming electrode plate and an aperture lens plate of a source conversion unit; and limiting beam currents of the plurality of beamlets exiting the aperture lens array, wherein the plurality of beamlets are focused, using an imaging lens of the source conversion unit, on an imaging plane to form a plurality of images that are projected onto a surface of the sample to generate a plurality of probe spots.

15. The charged particle beam apparatus of claim 10, wherein the second and the third voltages are substantially similar in magnitude.

16. The charged particle beam apparatus of claim 10, wherein the second and the third voltages are dissimilar in magnitude.

17. The charged particle beam apparatus of claim 1, wherein each of the plurality of aperture lenses comprises an electrostatic lens.

18. The charged particle beam apparatus of claim 10, wherein the beam-limit aperture array is further configured to be at the third voltage for generating a second electric field between the aperture lens plate and the beam-limit aperture array.

19. The charged particle beam apparatus of claim 18, wherein a magnitude of the first electric field is different from a magnitude of the second electric field, thereby forming a lens field corresponding to each aperture lens of the plurality of aperture lens of the aperture lens array.

20. The charged particle beam apparatus of claim 18, wherein the third voltage is similar to the second voltage such that the second electric field is zero.

* * * * *